US011852851B2

(12) United States Patent
Wang et al.

(10) Patent No.: US 11,852,851 B2
(45) Date of Patent: Dec. 26, 2023

(54) OPTICAL COMPENSATION STRIP, DISPLAY PANEL, DISPLAY DEVICE AND DRIVING METHOD

(71) Applicants: Beijing BOE Display Technology Co., Ltd., Beijing (CN); BOE Technology Group Co., Ltd., Beijing (CN)

(72) Inventors: Jianting Wang, Beijing (CN); Zhanchang Bu, Beijing (CN); Rui Guo, Beijing (CN); Zhiming Meng, Beijing (CN); Junning Su, Beijing (CN); Jianzi He, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 668 days.

(21) Appl. No.: 16/697,487

(22) Filed: Nov. 27, 2019

(65) Prior Publication Data

US 2020/0264346 A1      Aug. 20, 2020

(30) Foreign Application Priority Data

Feb. 19, 2019   (CN) .......................... 201910124041.4

(51) Int. Cl.
*G02B 5/04*      (2006.01)
*G09G 3/34*      (2006.01)
(Continued)

(52) U.S. Cl.
CPC ........... *G02B 5/045* (2013.01); *G09G 3/3406* (2013.01); *H05K 5/0017* (2013.01);
(Continued)

(58) Field of Classification Search
CPC ............ G02B 19/0066; G02B 19/0014; G02B 5/045; H05K 5/0021; H05K 5/03;
(Continued)

(56) References Cited

U.S. PATENT DOCUMENTS 8,378,577 B2   2/2013  Lai
9,612,468 B1   4/2017  Liu et al.
(Continued)

FOREIGN PATENT DOCUMENTS

CN    102192450 A    9/2011
CN    102262842 A    11/2011
(Continued)

OTHER PUBLICATIONS

English Translation of CN208156222 U, May 26, 2022, pp. 1-24 (Year: 2022).*

(Continued)

*Primary Examiner* — Jimmy H Nguyen
(74) *Attorney, Agent, or Firm* — Lippes Mathias LLP

(57) ABSTRACT

Provided are an optical compensation strip, a display panel, a display device and a driving method, and relates to the display technology field. The optical compensation strip is applicable to a spliced display panel. The optical compensation strip may comprise: a display cover plate, and at least two prisms disposed opposite to the display cover plate. A gap exists between each prism and the display cover plate. The at least two prisms are configured for refracting light emitted from the two adjacent sub-display panels to an area of the display cover plate corresponding to the seam.

18 Claims, 17 Drawing Sheets

(51) Int. Cl.
*H05K 5/00* (2006.01)
*H05K 5/03* (2006.01)

(52) U.S. Cl.
CPC ............. *H05K 5/0021* (2013.01); *H05K 5/03* (2013.01); *G09G 2300/026* (2013.01); *G09G 2340/045* (2013.01)

(58) Field of Classification Search
CPC .. H05K 5/0017; G09G 3/3406; G09G 3/3426; G09G 2300/026; G09G 2340/045
USPC ......................................................... 345/1.1
See application file for complete search history.

(56) References Cited

U.S. PATENT DOCUMENTS

| | | | |
|---|---|---|---|
| 2004/0013856 A1 | 1/2004 | Araki et al. | |
| 2005/0030633 A1 | 2/2005 | Detro et al. | |
| 2011/0128208 A1* | 6/2011 | Choi | H01J 11/34 345/60 |
| 2012/0293744 A1* | 11/2012 | Watanabe | G02F 1/133504 385/129 |
| 2013/0229798 A1* | 9/2013 | Shimakawa | G02B 5/045 362/235 |
| 2013/0286059 A1* | 10/2013 | Saishu | H04N 13/317 345/698 |
| 2013/0343038 A1 | 12/2013 | Niu et al. | |
| 2017/0131584 A1* | 5/2017 | Liu | G02F 1/133526 |
| 2017/0276912 A1 | 9/2017 | Yao et al. | |

FOREIGN PATENT DOCUMENTS

| | | |
|---|---|---|
| CN | 202549182 U | 11/2012 |
| CN | 204087706 U | 1/2015 |
| CN | 105448196 A | 3/2016 |
| CN | 106405723 A | 2/2017 |
| CN | 107479113 A | 12/2017 |
| CN | 108230913 A | 6/2018 |
| CN | 108563075 A | 9/2018 |
| CN | 108780210 A | 11/2018 |
| CN | 208156222 U | 11/2018 |
| JP | 2003315516 A | 11/2003 |
| KR | 20040000253 A | 1/2004 |
| TW | 201717174 A | 5/2017 |

OTHER PUBLICATIONS

English Translation of CN204087706 U, May 26, 2022, pp. 1-5 (Year: 2022).*
English Translation of CN107479113 A, May 26, 2022, pp. 1-6 (Year: 2022).*
Second office action of Chinese application No. 201910124041.4 dated Mar. 5, 2021.
First office action of Chinese application No. 201910124041.4 dated Aug. 26, 2020.

* cited by examiner

OPTICAL COMPENSATION STRIP, DISPLAY PANEL, DISPLAY DEVICE AND DRIVING METHOD

CROSS-REFERENCE TO RELATED APPLICATION

The present disclosure claims priority to Chinese Patent Application No. 201101124041.4, filed on Feb. 19, 2019 and entitled "OPTICAL COMPENSATION STRIP, DISPLAY DEVICE AND DRIVING METHOD", the entire contents of which are incorporated herein by reference.

TECHNICAL FIELD

The present disclosure relates to the field of display technologies, and in particular, relates to an optical compensation strip, a display panel, a display device, and a driving method.

BACKGROUND

In the display field, large-area display of an image is generally implemented by using a spliced display panel. The spliced display panel is generally formed by splicing a plurality of sub-display panels.

In the related art, in order to eliminate the seam between the sub-display panels, a light-emitting diode (LED) light bar is usually disposed between two adjacent sub-display panels, and a driving chip for driving the LED light bar is disposed in a driving circuit of the display device. The LED light bar may be driven to emit light by the driving chip, thereby achieving the effect of joining images displayed on two adjacent sub-display panels.

SUMMARY

The present disclosure provides a spliced display panel, a display panel, a display device, and a driving method. The technical solution is as follows:

In one aspect, an optical compensation strip is provided, which is applied to a spliced display panel. The optical compensation strip is disposed on a light emitting surface of two adjacent sub-display panels of the spliced display panel, and covers the seam of the adjacent two sub-display panels.

The optical compensation strip includes: a display cover plate, and at least two prisms disposed opposite to the display cover plate, the display cover plate being fixed on a light emitting surface of the adjacent two sub-display panels, the at least two prisms being located between the display cover plate and the light emitting surface; wherein
  a gap is present between each of the prisms and the display cover plate, and each of the prisms, the display cover plate, and the seam extend along a first direction; and
  the at least two prisms are configured to refract light emitted from two adjacent sub-display panels to a region of the display cover plate corresponding to the seam.

Optionally, the at least two prisms include: a first prism and a second prism proximal to each other; wherein an orthographic projection of a borderline between the first prism and the second prism at the light emitting surface is collinear with the central axis of the seam, the central axis being parallel to the first direction.

Optionally, an orthographic projection of a side face of the first prism distal from the second prism on the light emitting surface is located within a display area of a first sub-display panel of the two adjacent sub-display panels, for refracting light emitted from the first sub-display panel to an area of the display cover plate corresponding to the seam; and
  an orthographic projection of a side face of the second prism distal from the first prism on the light-existing surface is located within a display area of a second sub-display panel of the two adjacent sub-display panels, for refracting light emitted from the second sub-display panel to an area of the display cover plate corresponding to the seam.

Optionally, a maximum angle between the side face of the first prism distal from the second prism and the light emitting surface, and a maximum angle between the side face of the second prism distal from the first prism and the light emitting surface are both less a the first critical angle $\delta$, the first critical angle $\delta$ satisfying: $\delta=\arcsin(n2/n1)$;
  where n1 is a refractive index of the first prism, n2 is a refractive index of a medium between the first prism and the display cover plate; wherein the refractive index of the second prism is equal to the refractive index of the first prism.

Optionally, a spacing between the first prism and the display cover plate is greater than or equal to a first spacing, the first spacing satisfying: $H_1=d_0/(2\times\tan\alpha 1)$;
  a spacing between the second prism and the display cover plate is greater than or equal to a second spacing, the second spacing satisfying: $H_2=d_0/(2\times\tan\alpha 2)$;
  where $d_0$ is a length of the seam in the second direction;

$\alpha 1$ satisfies: $\alpha 1=\arcsin[(n1/n2)\times\sin\theta 1_{max}]-\theta 1_{max}$;

$\alpha 2$ satisfies: $\alpha 2=\arcsin[(n1/n2)\times\sin\theta 2_{max}]-\theta 2_{max}$;

$\theta 1_{max}$ is the maximum angle between the side face of the first prism distal from the second prism and the light emitting surface, and $\theta 2_{max}$ is the maximum angle between the side face of the second prism distal from the first prism and the light emitting surface;
  the second direction is perpendicular to the first direction, and the first direction and the second direction are both parallel to the light emitting surface.

Optionally, a side face of the first prism proximal to the second prism, and a side face of the second prism proximal to said first prism are both configured for total reflecting the light at the seam; and
  a difference between a spacing between the edge of the first prism proximal to the display cover plate and extending along the first direction and the edge of the second prism proximal to the display cover plate and extending along the first direction, and a length of the seam in the second direction, is less than a difference threshold;
  wherein the second direction is perpendicular to the first direction, and the first direction and the second direction are both parallel to the light emitting surface.

Optionally, an angle between the side face of the first prism proximal to the second prism and the light emitting surface, and an angle between the side face of the second prism proximal to the first prism and the light emitting surface are both greater than or equal to a first critical angle $\delta$, the first critical angle $\delta$ satisfying: $\delta=\arcsin(n2/n1)$;
  where n1 is a refractive index of the first prism, n2 is a refractive index of a medium between the first prism and the display cover plate; wherein the refractive index of the second prism is equal to the refractive index of the first prism.

Optionally, the at least two prisms further include: at least one third prism and at least one fourth prism; wherein
the at least one third prism is disposed on a side of the first prism distal from the second prism, and the at least one fourth prism is disposed on a side of the second prism distal from the first prism;
an orthographic projection of each of the at least one third prism on the light emitting surface is located within a display area of a first sub-display panel of the two adjacent sub-display panels, for refracting light emitted from the first sub-display panel to an area of the display cover plate corresponding to the seam; and
an orthographic projection of each of the at least one fourth prism on the light emitting surface is located within a display area of a second sub-display panel of the two adjacent sub-display panels, for refracting light emitted from the second sub-display panel to an area of the display cover plate corresponding to the seam.

Optionally, the optical compensation strip further includes: a prism substrate; wherein
the prism substrate and the display cover plate are fixed on a light emitting surface of the two adjacent sub-display panels, and one side of the prism substrate is in contact with the light emitting surface, and the other side of the prism substrate is in contact with the display cover plate;
wherein the side of the prism substrate that is in contact with the display cover plate is provided with a first groove, the at least two prisms are disposed in the first groove, and the first groove extends along the first direction.

Optionally, the side of the prism substrate distal from the display cover plate is provided with a second groove, wherein the second groove extends along the first direction, and an orthographic projection of a central axis of the second groove on the light emitting surface is collinear with a central axis of the seam, the central axis of the second groove and the central axis of the seam being both parallel to the first direction;
a difference between a sum of lengths of the borders at the seam of the adjacent two sub-display panels a the second direction and a length of the second groove in the second direction is less than a threshold; wherein the second direction is perpendicular to the first direction, and the first direction and the second direction are both parallel to the light emitting surface Optionally, a length of a side of the prism substrate proximal to the display cover plate in a second direction is less than a length of a side of the prism substrate distal from the display cover plate in the second direction;
a length of the display cover plate in the second direction is equal to a length of a side of the prism substrate proximal to the display cover plate in the second direction;
the second direction is perpendicular to the first direction, and the first direction and the second direction are both parallel to the light emitting surface.

Optionally, the material of the prism substrate includes: any one of a copolymer of methyl methacrylate and styrene, polycarbonate, polymethyl methacrylate and ground glass or a composition consisting of at least two of the above materials;
the material of the prism includes any one of a copolymer of methyl methacrylate and styrene, polycarbonate, polymethyl methacrylate and ground glass or a composition consisting of at least two of the above materials; and
the material of the display cover plate includes any one of a copolymer of methyl methacrylate and styrene, polycarbonate, polymethyl methacrylate and ground glass or a composition consisting of at least two of the above materials.

Optionally, a surface roughness of a region where the prism substrate is in contact with the sub-display panel is greater than a roughness threshold.

Optionally, one end of the optical compensation strip is a tip, and an angle of the tip is positively correlated with a length of the seam in a second direction;
the second direction is perpendicular to the first direction, and the first direction and the second direction are both parallel to the light emitting surface.

In another aspect, a spliced display device is provided. The spliced display device includes: at least two sub-display panels, at least one optical compensation strip as described in the above aspect. Each of the optical compensation strips is located on a light emitting surface of two adjacent sub-display panels, and covers a seam between the two adjacent sub-display panels.

In another aspect, a display device is provided. The display device includes: at least two sub-display panels, at least one optical compensation strip as described in the above aspect, and at least two backlight modules in a one-to-one correspondence with the at least two sub-display panels; wherein
each of the optical compensation strips is located on a light emitting surface of two adjacent sub-display panels and covering a seam between the two adjacent sub-display panels; and
each of the backlight modules is located at a light incident surface of the sub-display panel corresponding thereto;

In a further aspect, a driving method of a backlight module is provided for driving the backlight module of the display device as described in the above aspect, the backlight modules being disposed on a light incident surface of a target sub-display panel, the backlight modules being direct type backlight modules, and the backlight modules including a plurality of light-emitting units. The method includes:
determining a luminance compensation coefficient according to a first length of a path-transformation display area and a sum of a first length of the path-transformation display area and a second length of a compensation display area in the display area of the target sub-display panel, the luminance compensation coefficient being greater than one, and the luminance compensation coefficient being negatively correlated with the first length and positively correlated with the sum of the lengths; and
compensating for a driving signal of a target light-emitting unit of the plurality of light-emitting units according to the luminance compensation coefficient, an orthographic projection of the target light-emitting unit at the target sub-display panel being located within the path-transformation display area;
wherein the path-transformation display area is an area of the display area covered by orthographic projections of at least two prisms of the target optical compensation strip and the path-transformation display area extends along the first direction, the compensation display area is an area of the target optical compensation strip covering the seam, and the compensation display area extends along the first direction, the first length is a length of the path-transformation display area in a second direction, the second length is a length of the compensation display area in the second direction, the target optical compensation strip is disposed on a light emitting surface of the target sub-display panel and extends along the first direction, the second direction is perpendicular to the first direction, and the first direction and the second direction are both parallel to the light emitting surface.

Optionally, the determining a luminance compensation coefficient according to a first length of a path-transformation display area and a sum of a first length of the path-transformation display area and a second length of the compensation display area in the display area of the target sub-display panel includes:

determining a ratio of the sum of the lengths to the first length as a luminance compensation coefficient.

Optionally, the compensating for a driving signal of a target light-emitting unit of the plurality of light-emitting units according to the luminance compensation coefficient includes:

adjusting the driving signal of the target light-emitting unit such that a ratio of the signal value of the adjusted driving signal of the target light-emitting unit to the signal value of the driving signal of other light-emitting unit is the luminance compensation coefficient.

In a further aspect, a driving method of a sub-display panel is provided for driving a target sub-display panel of the spliced display panel as described in the above aspect, or a target sub-display panel of the display device as described in the above aspect, wherein the light emitting surface of the target sub-display panel is provided with a target optical compensation strip extending along a first direction. The method includes:

determining a first scaling factor of a normal display area of the target sub-display panel, and a second scaling factor of a path-transformation display area of the target sub-display panel respectively, the first scaling factor being positively correlated with a sum of lengths of the normal display area, the path-transformation display area, and a compensation display area of the target optical compensation strip in the second direction, and being negatively correlated with a sum of lengths of the normal display area and the path-transformation display area in the second direction; the second scaling factor being positively correlated with a sum of lengths of the normal display area, the path-transformation display area, and the compensation display area in the second direction, and a length of the path-transformation display area in the second direction respectively; and being negatively correlated with a sum of lengths of the normal display area and the path-transformation display area in the second direction, and a sum of lengths of the path-transformation display area and the compensation display area in the second direction respectively; and the second direction is perpendicular to the first direction, and the first direction and the second direction are both parallel to the light emitting surface;

scaling an image in a normal display area of the target sub-display panel along the second direction according to the first scaling factor; and scaling an image in a path-transformation display area of the target sub-display panel along the second direction according to the second scaling factor;

wherein the path-transformation display area is an area of a display area covered by orthographic projections of at least two prisms of the target optical compensation strip, the normal display area is an area of the display area that is not covered by orthographic projections of at least two prisms of the target optical compensation strip, and the compensation display area is an area of the target optical compensation strip covering the seam.

Optionally, the first scaling factor $k1$ satisfies:
$k1 = L1/L0$; and the second scaling factor $k2$ satisfies: $k2 = (L1 \times d_2)/(L0 \times d_1)$;

where $L1$ is a sum of lengths of the normal display area, the path-transformation display area, and the compensation display area in the second direction, $L0$ is a sum of lengths of the normal display area and the path-transformation display area in the second direction, $d_2$ is a length of the path-transformation display area in the second direction, and $d_1$ is a sum of lengths of the path-transformation display area and the compensation display area in the second direction.

In a further aspect, a driving device for a backlight module is provided. The driving device may be configured to drive the backlight modules in the display device as described in the above aspect, the backlight module is disposed on a light incident surface of a target sub-display panel, and the backlight module is a direct type backlight module, wherein a light source of the backlight module includes a plurality of LED light-emitting units. The device includes:

a determining module, configured to determine a luminance compensation coefficient according to a first length of a path-transformation display area, and a sum of a first length of the path-transformation display area and a second length of the compensation display area, in the display area of the target sub-display panel, the luminance compensation coefficient being greater than one, and the luminance compensation coefficient being negatively correlated with the first length and positively correlated with the sum of the lengths; and a compensating module, configured to compensate for a driving signal of a target light-emitting unit of the plurality of light-emitting units according to the luminance compensation coefficient, an orthographic projection of the target light-emitting unit at the target sub-display panel being located within the path-transformation display area;

wherein the path-transformation display area is an area of the display area covered by orthographic projections of at least two prisms of the target optical compensation strip and the compensation display area is an area of the target optical compensation strip covering the seam, the first length is a length of the path-transformation display area in a second direction, the second length is a length of the compensation display area in the second direction, the target optical compensation strip is disposed on a light emitting surface of the target sub-display panel and extends along the first direction, the second direction is perpendicular to the first direction, and the first direction and the second direction are both parallel to the light emitting surface.

Optionally, the determining module is configured to determine a ratio of the sum of the lengths to the first length as the luminance compensation coefficient.

Optionally, the compensating module is configured to adjust a driving signal of the target light-emitting unit such that a ratio of the signal value of the adjusted driving signal of the target light-emitting unit to the signal value of the driving signal of other light-emitting unit is the luminance compensation coefficient.

In a further aspect, a driving device for a sub-display panel is provided for driving a target sub-display panel of the spliced display panel, wherein the light emitting surface of the target sub-display panel may be provided with a target optical compensation strip extending along a first direction. The device includes:

- a determining module, configured to determine a first scaling factor of a normal display area of the target sub-display panel, and a second scaling factor of a path-transformation display area of the target sub-display panel respectively, the first scaling factor being positively correlated with a sum of lengths of the normal display area, the path-transformation display area, and the compensation display area of the target optical compensation strip in the second direction, and being negatively correlated with a sum of lengths of the normal display area and the path-transformation display area in the second direction; the second scaling factor being positively correlated with a sum of lengths of the normal display area, the path-transformation display area, and the compensation display area in the second direction, and a length of the path-transformation display area in the second direction respectively; and being negatively correlated with a sum of lengths of the normal display area and the path-transformation display area in the second direction, and a sum of lengths of the path-transformation display area and the compensation display area in the second direction respectively;
- wherein the second direction is perpendicular to the first direction, and the first direction and the second direction are both parallel to the light emitting surface;
- a first scaling module, configured to scale an image in a normal display area of the target sub-display panel along the second direction according to the first scaling factor; and
- a second scaling module, configured to scale an image in a path-transformation display area of the target sub-display panel along the second direction according to the second scaling factor;
- wherein the path-transformation display area is an area of a display area covered by orthographic projections of at least two prisms of the target optical compensation strip, the normal display area is an area of the display area that is not covered by orthographic projections of at least two prisms of the target optical compensation strip, and the compensation display area is an area of the target optical compensation strip covering the seam.

Optionally, the first scaling factor $k1$ satisfies: $k1=L1/L0$; and the second scaling factor $k2$ satisfies: $k2=(L1 \times d_2)/(L0 \times d_1)$;

where L1 is a sum of lengths of the normal display area, the path-transformation display area, and the compensation display area in the second direction, L0 is a sum of lengths of the normal display area and the path-transformation display area in the second direction, $d_2$ is a length of the path-transformation display area in the second direction, and $d_1$ is a sum of lengths of the path-transformation display area and the compensation display area in the second direction.

In still another aspect, another drive device is provided. The device may include: a processing component, a memory, and a computer program stored on the memory and operable on the processing component; wherein the processing component may be a processing circuit or a processing unit; and when the processing component executes the computer program, the driving method of the backlight module or the driving method of the sub-display panel according to the above aspects may be implemented.

In still another aspect, a computer-readable storage medium is provided. The computer-readable storage medium stores instructions, which, when executed on a computer, cause the computer to perform the driving method of the backlight module or the driving method of the sub-display panel according to the above aspects.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

In the related art, a method of disposing an LED light bar between two adjacent sub-display panels to eliminate a seam therebetween is provided. The mounting is complex and the cost is high. In addition, in order to eliminate the seam between the sub-display panels, it is also generally possible to provide an optical cover plate on the light emitting surface of the spliced display panel, and an optical compensation is performed by the optical cover plate to improve the display effect of the spliced display panel. However, the optical cover plate has a high weight and thus is difficult to be mounted.

The optical compensation strip according to the embodiment of the present disclosure may be labeled at the seam between two adjacent sub-display panels, which may not only effectively eliminate the seam, but also is convenient in mounting and low in cost.

Figure 1:
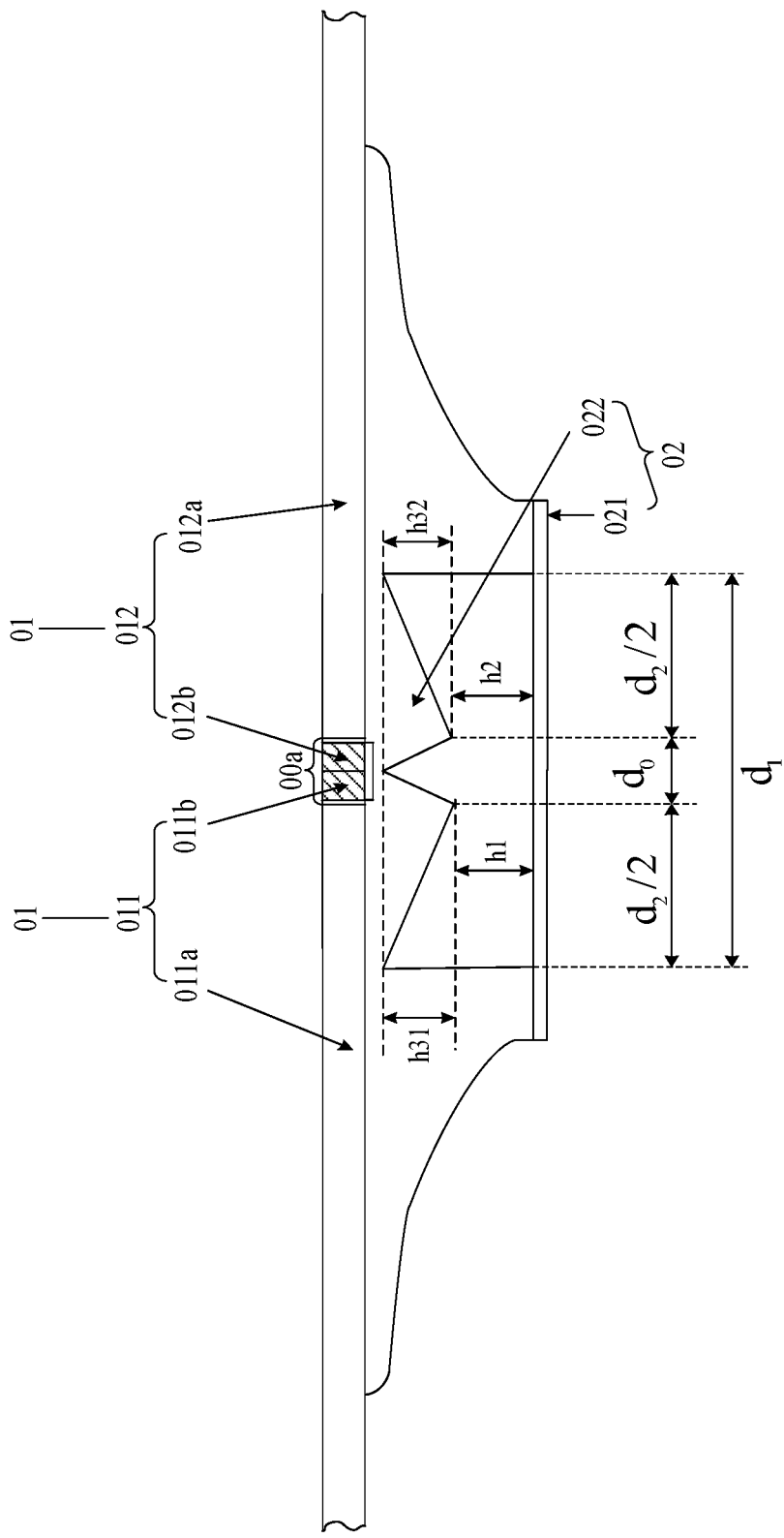
FIG. 1 is a schematic structural diagram of a spliced display panel according to an embodiment of the present disclosure.

FIG. 1 is a schematic diagram of structure of a spliced display panel according to an embodiment of the present disclosure. Referring to FIG. 1, the spliced display panel may include: a plurality of sub-display panels 01 spliced together, and at least one optical compensation strip 02. Each of the optical compensation strips 02 may be located on the light emitting surface of two adjacent sub-display panels 01 in the spliced display panel, and covers the seam 00a between the two adjacent sub-display panels 01. For example, FIG. 1 shows two sub-display panels 01, and an optical compensation strip 02 located on the light emitting surface of the two sub-display panels 01.

Figure 2:
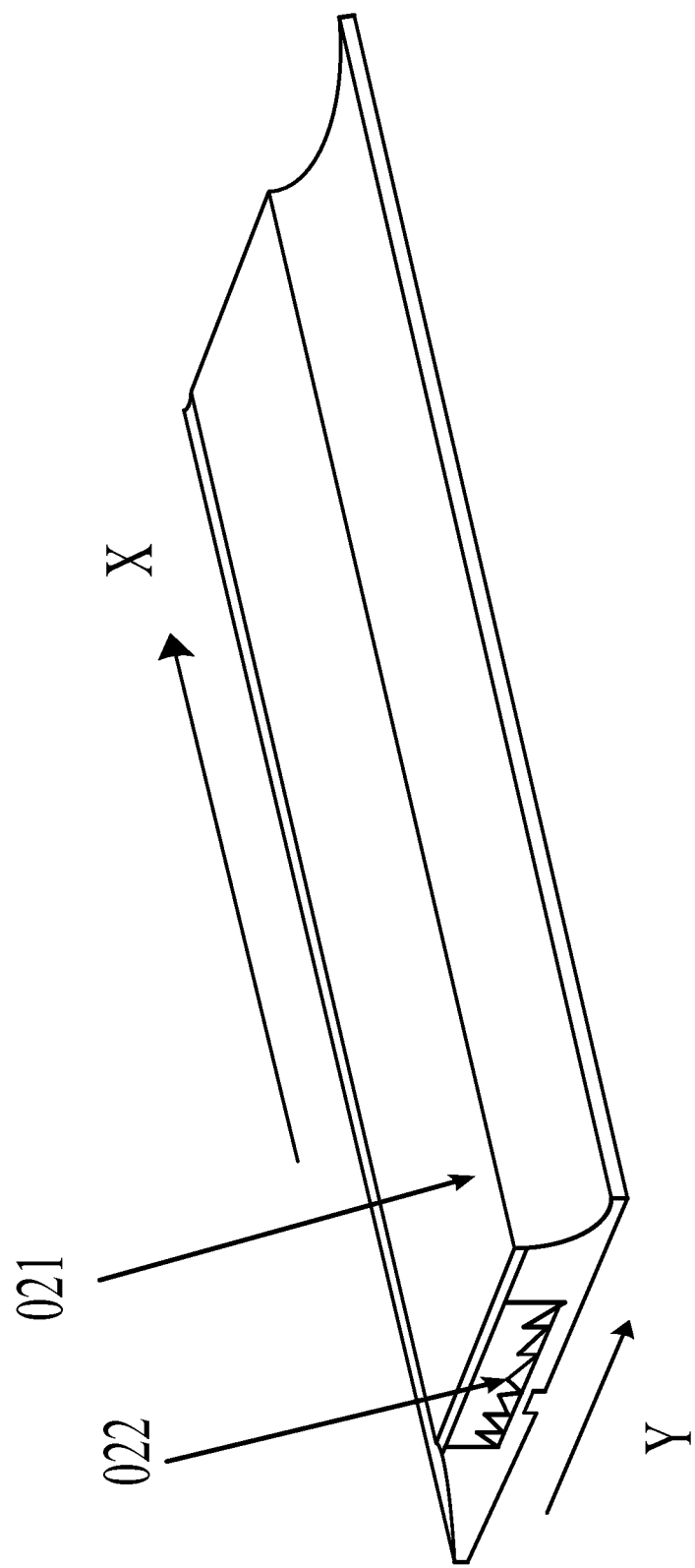
FIG. 2 is a schematic structural diagram of an optical compensation strip according to an embodiment of the present disclosure.

FIG. 2 is a schematic diagram of structure of an optical compensation strip according to an embodiment of the present disclosure. The optical compensation strip 02 may be applied to the spliced display panel shown in FIG. 1. As seen from FIG. 1 and FIG. 2, the optical compensation strip 02 may include: a display cover plate 021, and at least two prisms 022 disposed opposite to the display cover plate 021. The display cover plate 021 may be fixed onto the light emitting surface of the two adjacent sub-display panels 01, and the at least two prisms 022 may be located between the display cover plate 021 and the light emitting surface of the two adjacent sub-display panels 01.

For example, two prisms 022 are shown in the structure of FIG. 1, and six prisms 022 are shown in the structure of FIG. 2.

As shown in FIGS. 1 and 2, a gap may be present between each of the prisms 022 and the display cover plate 021. Each of the prisms 022, the display cover plate 021, and the seam 00a may all extend along the first direction X, wherein the first direction X may be parallel to the light emitting surface of two adjacent sub-display panels in the spliced display panel.

The at least two prisms 022 may be configured to refract light emitted from two adjacent sub-display panels 01 along a direction proximal to the seam 00a, to enable the light to be refracted to an area of the display cover plate 021 corresponding to the seam 00a, such that the area of the display cover plate 021 corresponding to the seam 00a may also display an image, thereby achieving the effect of eliminating the seam 00a. The area of the display cover plate 021 corresponding to the seam 00a may refer to the area where the orthographic projection of the seam 00a on the display cover plate 021 is located.

In summary, the embodiments of the present disclosure provide an optical compensation bar, which may be applied to a spliced display panel. The optical compensation strip may include a display cover plate and at least two prisms disposed opposite to the display panel. There is a gap between each prism and the display cover plate. The at least two prisms are configured for refracting light emitted from two adjacent sub-display panels to an area of the display cover plate corresponding to the seam, such that the area of the display cover plate corresponding to the seam may also display an image, thereby achieving the effect of eliminating the seam. Moreover, when a spliced display panel is assembled, the optical compensation strip at the seam between the two adjacent sub-display panels is labeled, which facilitates the mounting and lowers the cost.

In the embodiment of the present disclosure, the seam 00a between two adjacent sub-display panels 01 may include a frame area of the two sub-display panels 01, and a non-display area at the seam of the two sub-display panels 01. That is, the seam between the two adjacent sub-display panels 01 may refer to an area between the two spliced sub-display panels that may not display an image.

Figure 3:
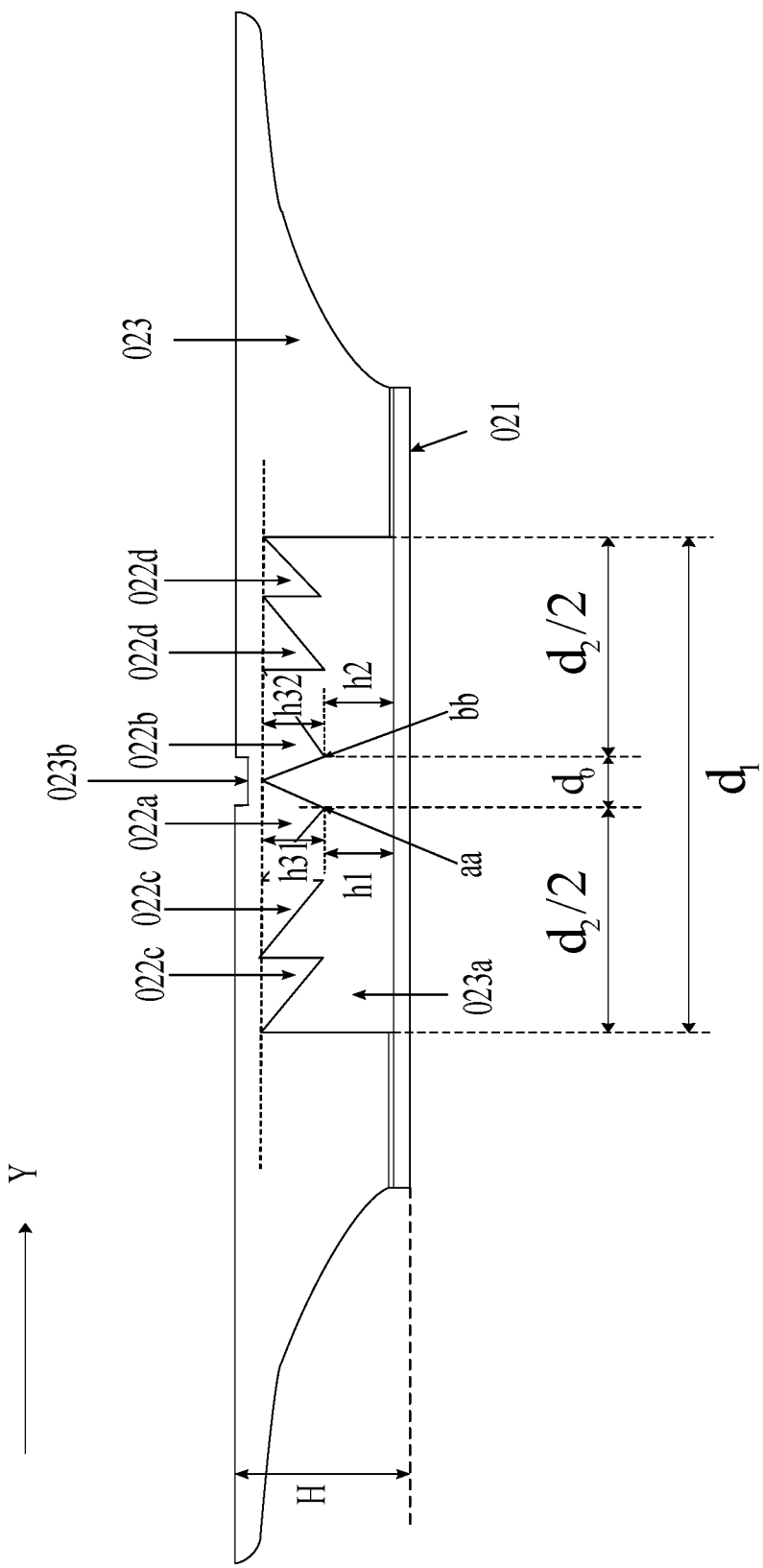
FIG. 3 is a schematic structural diagram of another optical compensation strip according to an embodiment of the present disclosure.

FIG. 3 is a schematic diagram of structure of another optical compensation strip according to an embodiment of the present disclosure. As seen from FIG. 3, the optical compensation strip 02 may also include a prism substrate 023. The prism substrate 023 may be fixed on the light emitting surface of the two adjacent sub-display panels 01, and one side of the prism substrate 023 may be in contact with the light emitting surface of the two adjacent sub-display panels 01, and the other side of the prism substrate 023 may be in contact with the display cover plate 021.

The side of the prism substrate 023 that is in contact with the display cover plate 021 may further be provided with a first groove 023a, and the at least two prisms 022 may be disposed in the first groove 023a, and the prism substrate 023 and the first groove 023a may both extend along the first direction X.

Optionally, as shown in FIG. 3, the side of the prism substrate 023 distal from the display cover plate 021 may further be provided with a second groove 023b, the second groove 023b may extend along the first direction X, and the orthographic projection of the central axis of the second groove 023b on the light emitting surface of the sub-display panel is collinear with the central axis of the seam 00a. The central axis of the second groove 023b and the central axis of the seam 00a may both be parallel to the first direction X. By disposing the second groove 023b, it is easy to determine the position of the optical compensation strip 02, thereby accurately labeling the optical compensation strip 02 at the seam 00a.

In the embodiment of the present disclosure, the prism substrate 023 and the at least two prisms 022 may be an integrated structure. Alternatively, the prism substrate 023 and at least two prisms 022 may be bonded and fixed by adhesives such as an optical adhesive. Alternatively, the optical compensation strip 02 does not include the prism substrate 023, and one side of the display cover plate 021 proximal to the light emitting surface 01 of the two adjacent sub-display panels may be directly fixed onto the light emitting surface of the two adjacent sub-display panels 01 (i.e., directly contacting the light emitting surface), and the side of the display cover plate 021 proximal to the light emitting surface of the two adjacent sub-display panels 01 may be provided with a groove, and at least two prisms 022 may be located in the groove, and at least two prisms 022 may be directly fixed on the light emitting surface of the two adjacent sub-display panels 01 (i.e., directly contacting the light emitting surface).

Since there is still a certain gap at the seam after the two adjacent sub-display panels are spliced, the ambient light may be incident from the gap to the optical compensation strip, causing interference to the light incident onto the optical compensation strip from the sub-display panel. Therefore, in the embodiment of the present disclosure, the at least two prisms may not only refract the light emitted by the sub-display panel 01 but also totally reflect the light at the seam 00a, i.e., totally reflect the ambient light leaked from the gap of the seam between the two adjacent sub-display panels, such that the light at the seam 00a may be broken, to prevent the interference caused by the light emitted from the seam 00a to the light incident onto the optical compensation strip 02 from the sub-display panel, thereby ensuring the display effect of the display cover plate 021.

Referring to FIG. 3, it may be seen that the at least two prisms 022 may include: a first prism 022a and a second prism 022b proximal to each other; the orthogonal projection of the borderline between the first prism 022a and the second prism 022b on the light-emitting surface of the sub-display panel may be collinear with the central axis of the seam 00a. The central axis may be parallel to the first direction X.

Figure 4:
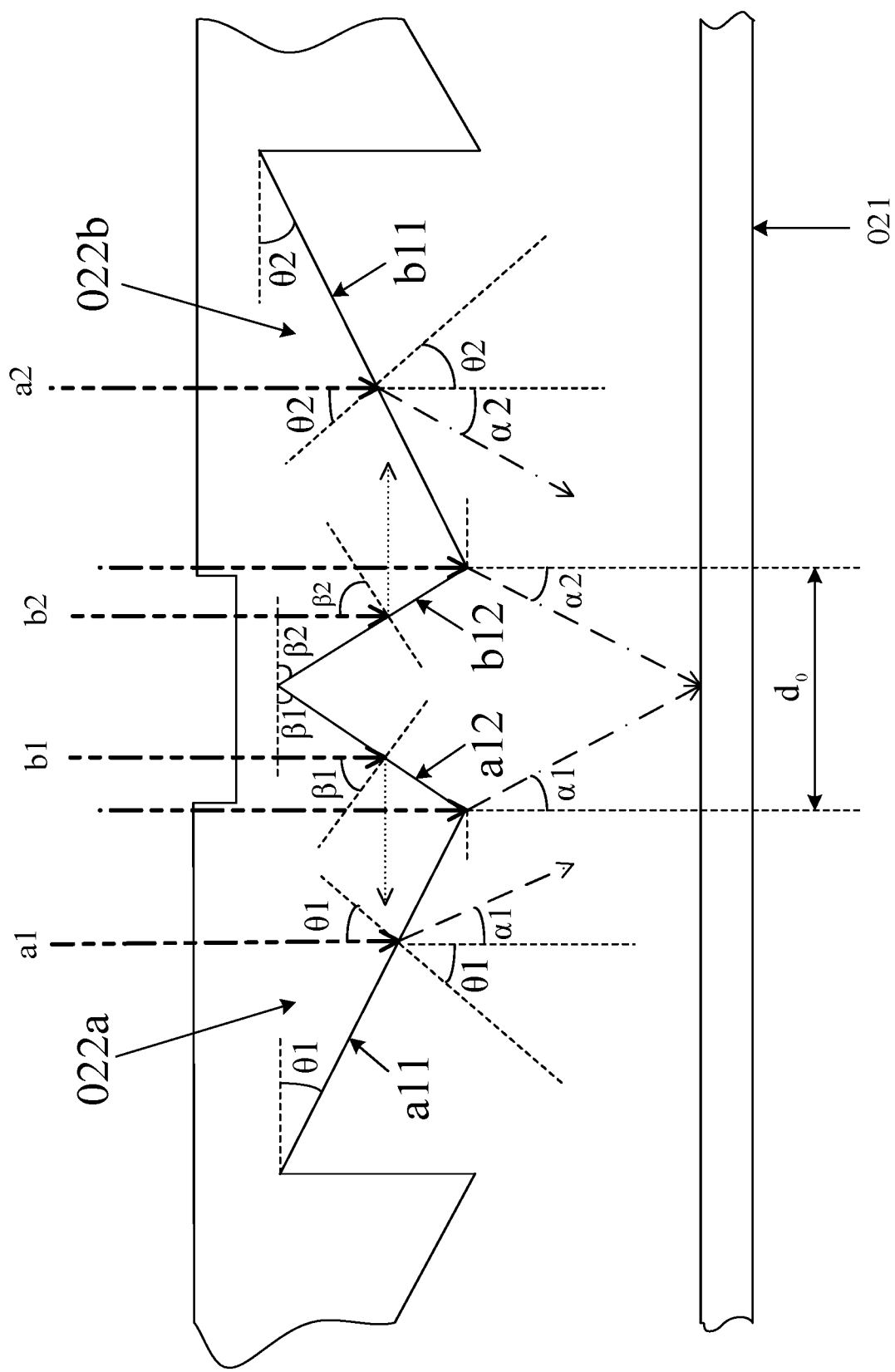
FIG. 4 is a partially enlarged schematic structural diagram of the optical compensation strip shown in FIG. 3.

FIG. 4 is a schematic diagram of partially enlarged structure of the optical compensation strip shown in FIG. 3. In combination with FIG. 1 and FIG. 4, it may be seen that the orthographic projection of the side surface a11 of the first prism 022a distal from the second prism 022b on the light emitting surface of the sub-display panel may be located within the display area 011a of the first sub-display panel 011 of the two adjacent sub-display panels 01. The side face a11 of the first prism 022a distal from the second prism 022b may be configured to refract the light emitted from the first sub-display panel 011 to an area of the display cover plate 021 corresponding to the seam 00a.

The orthographic projection of the side surface b11 of the second prism 022b distal from the first prism 022a on the light emitting surface of the sub-display panel may be located within the display area 012a of the second sub-display panel 012 of the two adjacent sub-display panels 01, and the side surface b11 of the second prism 022b distal from the first prism 022a may be configured to refract light emitted from the second sub-display panel 012 to an area of the display cover plate 021 corresponding to the seam 00a.

The light may be refracted at the side face a11 of the first prism 022a distal from the second prism 022b and the side face of the second prism 022b distal from the first prism 022a, and the refracted light may be offset in a direction proximal to the seam 00a, thereby enabling the image to be displayed at seam 00a, and achieving the effect of eliminating the seam 00a.

Optionally, a side face a12 of the first prism 022a proximal to the second prism 022b, and a side face b12 of the second prism 022b proximal to the first prism 022a may both be configured to totally reflect the light at the seam 00a.

Referring to FIGS. 3-4, the difference between a spacing $d_0$ between the edge aa of the first prism 022a proximal to the display cover plate 021 and extending along the first direction X and the edge bb of the second prism 022b proximal to the display cover plate 021 and extending along the first direction X, and a length of the seam 00a in the second direction Y (i.e., the width of the seam 00a), may be less than a difference threshold. For example, the spacing $d_0$ may be equal to the length of the seam 00a in the second direction Y. Therefore, it may be ensured that the light at the seam will not be refracted by the optical compensation strip to the display cover plate 021, which ensures the display effect of the display cover plate 021. The second direction Y may be perpendicular to the first direction X, and the second direction Y may be parallel to the light emitting surface of the sub-display panel.

In FIG. 4, a1 is the light emitted from the display area 011a of the first sub-display panel 011 of the two adjacent sub-display panels 01, and a2 is the light emitted from the display area 012a of the second sub-display panel 012 of the two adjacent sub-display panels 01. Light b1 and light b2 are light beams at the seam 00a. As seen from FIG. 4, the light incident onto the optical compensation strip 02 from the display area of the sub-display panel is perpendicular to the light emitting surface of the sub-display panel, and the light incident onto the optical compensation strip 02 from the seam 00a is also perpendicular to the light emitting surface of the sub-display panel.

In combination with FIGS. 3 to 4, in order to ensure that the light emitted from the sub-display panel 01, i.e., the light a1 and the light a2, may be refracted at the side face a11 of the first prism 022a distal from the second prism 022b and the side face b11 of the second prism 022b distal from the first prism 022a, the incident angle θ1 of the light a1 emitted from the first sub-display panel 011 at the side face a11 of the first prism 022a distal from the second prism 022b and the incident angle θ2 of the light a2 emitted from the second sub-display panel 012 at the side face b11 of the second prism 022b distal from the first prism 022a may be made to be both less than a first critical angle δ. The first critical angle δ may satisfy:

$$\Delta = \arcsin(n2/n1) \qquad \text{equation (1);}$$

where n1 is the refractive index of the first prism 022a, n2 is the refractive index of the medium between the first prism 022a and the display cover plate 021, and the refractive index of the second prism 022b may be equal to the refractive index of the first prism 022a, wherein arcsin is an inverse sine function.

The incident angle θ1 of the light a1 emitted from the first sub-display panel 011 at the side face a11 of the first prism 022a distal from the second prism 022b is equal to the angle between the cut surface at the light incident point of the side face a11 of the first prism 022a distal from the second prism 022b and the light emitting surface of the sub-display panel, and the incident angle θ2 of the light a2 emitted from the second sub-display panel 012 at the side face b11 of the second prism 022b distal from the first prism 022a is equal to the angle between the cut surface at the light incident point of the side face b11 of the second prism 022b distal from the first prism 022a and the light emitting surface of the sub-display panel. Therefore, in the optical compensation strip 02 according to the embodiment of the present disclosure, the maximum angle $θ1_{max}$ between the side face a11 of the first prism 022a distal from the second prism 022b and the light emitting surface of the sub-display panel, and the maximum angle $θ2_{max}$ between the side face b11 of the second prism 022b distal from the first prism 022a and the light emitting surface of the sub-display panel may be both less than the first critical angle δ, that is, $θ1_{max} < δ$, $θ2_{max} < δ$.

In one aspect, as seen from FIG. 4, when the side face a11 of the first prism 022a distal from the second prism 022b and the side face b11 of the second prism 022b distal from the first prism 022a are both flat surfaces, the angle θ1 between the side face a11 of the first prism 022a distal from the second prism 022b and the light emitting surface of the sub-display panel is a fixed value. The angle θ1 is the maximum angle $θ1_{max}$ between the side face a11 of the first prism 022a distal from the second prism 022b and the light emitting surface of the sub-display panel. The incident angle θ2 between the side face b11 of the second prism 022b distal from the first prism 022a and the light emitting surface of the sub-display panel is also a fixed value. The angle θ2 is the maximum angle $θ2_{max}$ between the side face b11 of the second prism 022b distal from the first prism 022a and the light emitting surface of the sub-display panel.

Therefore, when the side face a11 of the first prism 022a distal from the second prism 022b and the side face b11 of the second prism 022b distal from the first prism 022a are both flat surfaces, the angle θ1 between the side face a11 of the first prism 022a distal from the second prism 022b and the light emitting surface of the sub-display panel and the angle θ2 between the side face b11 of the second prism 022b distal from the first prism 022a and the light emitting surface of the sub-display panel may be disposed to be both less than the first critical angle δ. The angle θ1 and the angle θ2 may be equal or unequal, which is not limited by the embodiment of the present disclosure.

Figure 5:
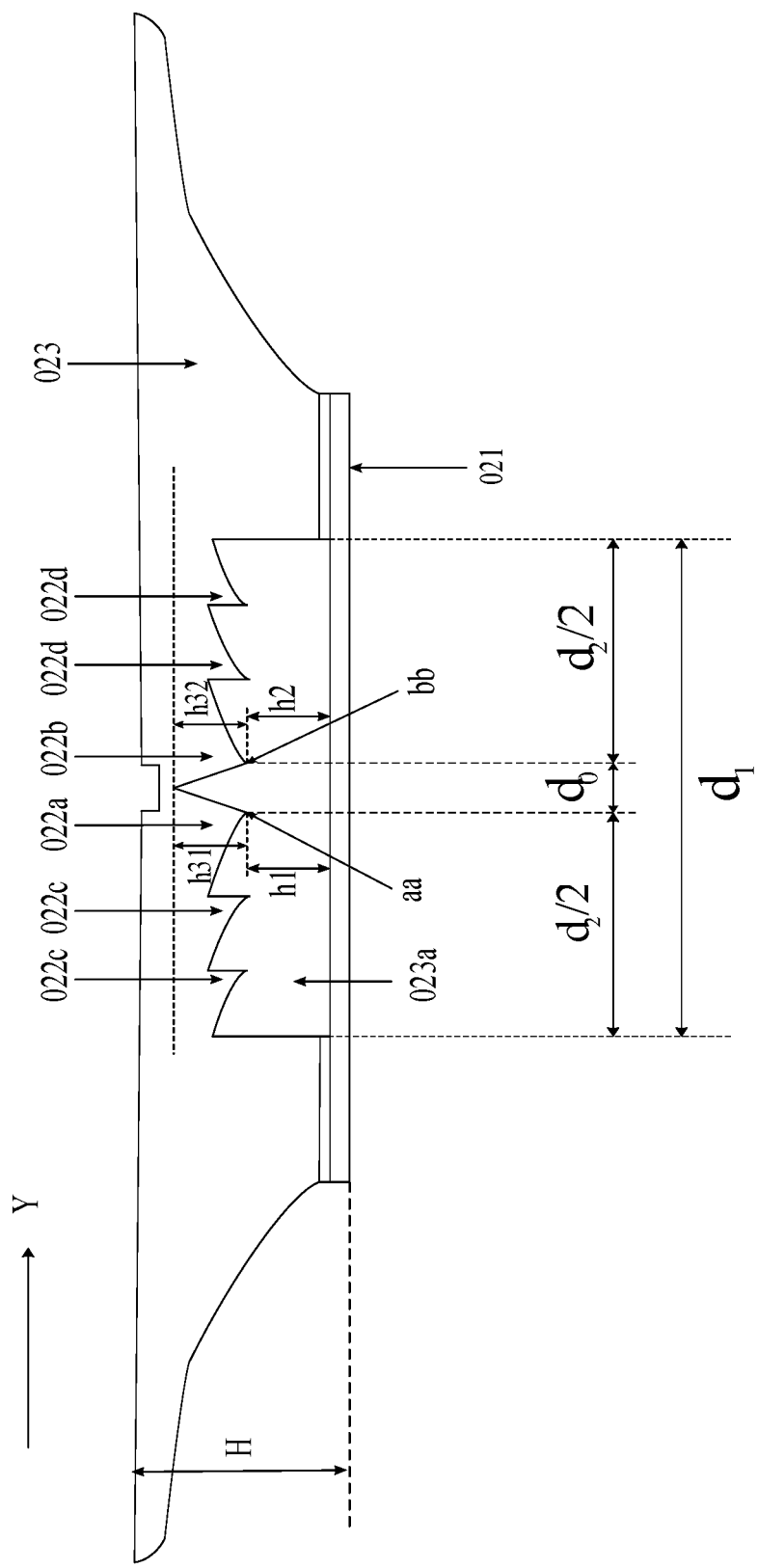
FIG. 5 is a schematic structural diagram of still another optical compensation strip according to an embodiment of the present disclosure.

In another aspect, FIG. 5 is a schematic diagram of structure of still another optical compensation strip according to an embodiment of the present disclosure. As seen from FIG. 5, when the side face a11 of the first prism 022a distal from the second prism 022b and the side face b11 of the second prism 022b distal from the first prism 022a are both curved surfaces, the angle between the side face a11 of the first prism 022a distal from the second prism 022b and the light emitting surface of the sub-display panel may refer to the angle between the cut surface of the side face a11 of the first prism 022a distal from the second prism 022b and the light emitting surface of the sub-display panel; the angle between the side face b11 of the second prism 022b distal from the first prism 022a and the light emitting surface of the sub-display panel may refer to the angle between the cut surface of the side face b11 of the second prism 022b distal from the first prism 022a and the light emitting surface of the sub-display panel.

Referring to FIG. 5, it may be seen that, on the side face a11 of the first prism 022a distal from the second prism 022b, the angles between the cut surfaces at different positions and the light emitting surface of the sub-display panel are different. On the side face b11 of the second prism 022b distal from the first prism 022a, the angles between the cut surfaces at different positions and the light emitting surface of the sub-display panel are also different. That is, the angle between the cut surface of the side face a11 of the first prism 022a distal from the second prism 022b and the light emitting surface of the sub-display panel, and the angle between the cut surface of the side face b11 of the second prism 022b distal from the first prism 022a and the light emitting surface of the sub-display panel are both not fixed values, and the magnitude of each angle is related to the position at which the light is incident.

Figure 6:
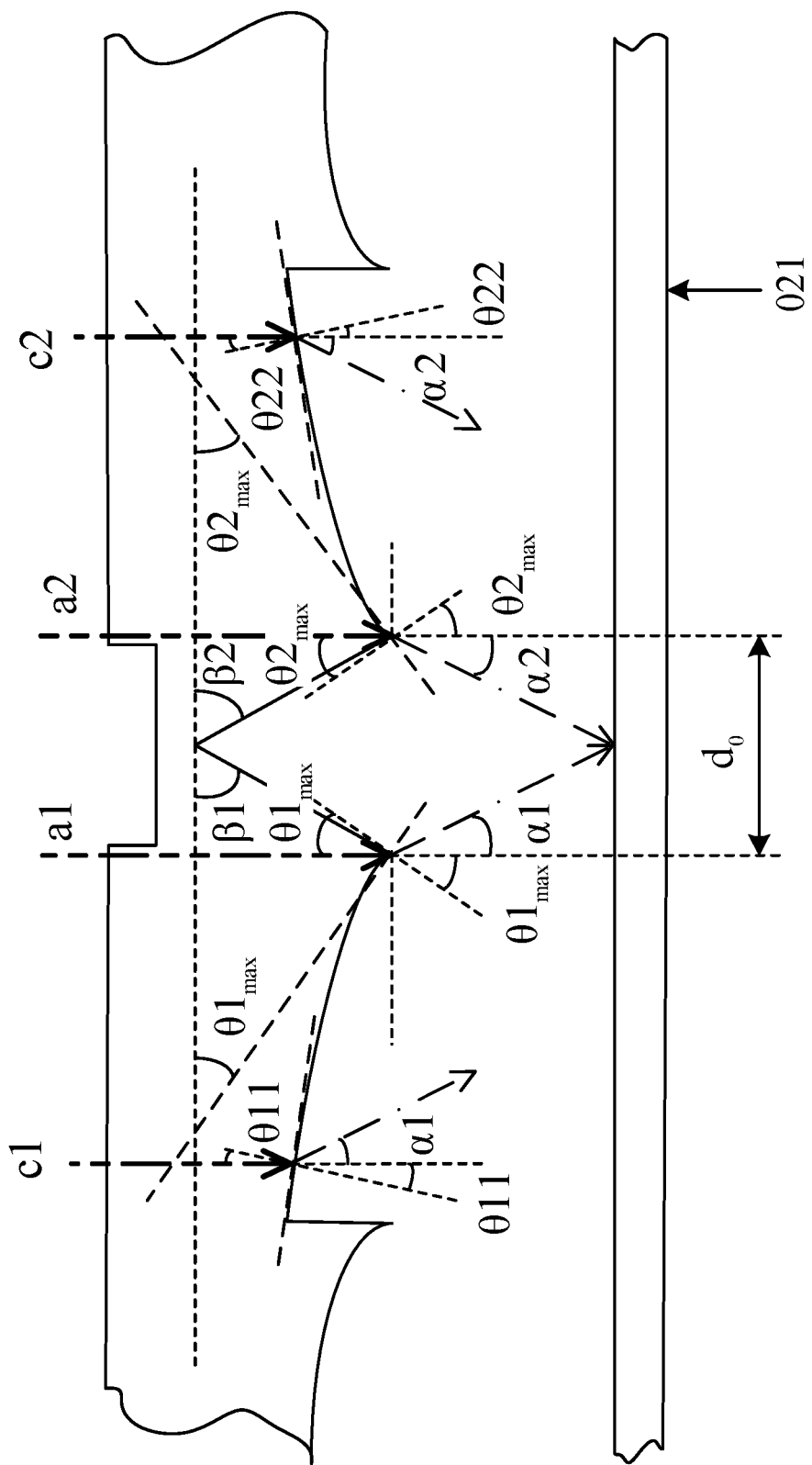
FIG. 6 is a partially enlarged schematic structural diagram of the optical compensation strip shown in FIG. 5.

Illustratively, FIG. 6 is a schematic diagram of partially enlarged structure of the optical compensation strip shown in FIG. 5. Referring to FIG. 6, a1 and c1 are light beams emitted from the display area 011a of the first sub-display panel 011 of the two adjacent sub-display panels 01, and a2 and c2 are light beams emitted from the display area 012a of the second sub-display panels 012 of the two adjacent sub-display panels 01. The light a1 is proximal to the seam between the two sub-display panels with respect to the light c1, and the light a2 is proximal to the seam between the two sub-display panels with respect to the light c2.

On the side face a11 of the first prism 022a distal from the second prism 022b, the angle θ11 between the cut surface at the incident point of the light c1 and the light emitting surface of the sub-display panel is less than the angle $θ1_{max}$ between the cut surface at the incident point of the light a1 and the light emitting surface of the sub-display panel. On the side face b11 of the second prism 022b distal from the first prism 022a, the angle θ22 between the cut surface at the incident point of the light c2 and the light emitting surface of the sub-display panel is less than angle $θ2_{max}$ between the cut surface at the incident point of the light a2 and the light emitting surface of the sub-display panel.

Referring to FIG. 6, it may be seen that the angle between the cut surface at the edge aa of the first prism 022a proximal to the display cover plate 021 and extending along the first direction X and the light emitting surface of the sub-display panel is maximum, and the angle is the maximum angle $θ1_{max}$ between the side face a11 of the first prism 022a distal from the second prism 022b and the light emitting surface of the sub-display panel. The angle between the cut surface at the edge bb of the second prism 022b proximal to the display cover plate 021 and extending along the first direction X and the light emitting surface of the sub-display panel is maximum, and the angle is the maximum angle $θ2_{max}$ between the side face b11 of the second prism 022b distal from the first prism 022a and the light emitting surface of the sub-display panel.

Therefore, in order to ensure that the side face a11 of the first prism 022a distal from the second prism 022b, and the side face b11 of the second prism 022b distal from the first prism 022a may both effectively refract the light emitted by the sub-display panel, it is necessary to ensure that the maximum angle $θ1_{max}$ between the side face a11 of the first prism 022a distal from the second prism 022b and the light emitting surface of the sub-display panel and the maximum angle $θ2_{max}$ between the side face b11 of the second prism 022b distal from the first prism 022a and the light emitting surface of the sub-display panel are both less than the first critical angle δ.

That is, when the side face a11 of the first prism 022a distal from the second prism 022b and the side face b11 of the second prism 022b distal from the first prism 022a are both curved surfaces, the angle between the cut surface of the side face a11 of the first prism 022a distal from the second prism 022b at the edge aa of the first prism 022a proximal to the display cover plate 021 and extending along the first direction X and the light emitting surface of the sub-display panel is less than the first critical angle δ. And the angle between the cut surface of the side face b11 of the second prism 022b distal from the first prism 022a at the edge bb of the second prism 022b proximal to the display cover plate 021 and extending along the first direction X and the light emitting surface of the sub-display panel is less than the first critical angle δ.

Optionally, the maximum angle $θ1_{max}$ between the side face a11 of the first prism 022a distal from the second prism 022b and the light emitting surface of the sub-display panel and the maximum angle $θ2_{max}$ between the side face b11 of the second prism 022b distal from the first prism 022a and the light emitting surface of the sub-display panel may be equal or unequal, which is not limited by the embodiment of the present disclosure.

Assuming that the refractive indices of the first prism 022a and the second prism 022b in the optical compensation strip 02 are equal, and the refractive index n1=1.49, and assuming that the medium between the first prism 022a and the display cover plate 021 is air, then it may be determined that the refractive index of the air n2=1.

According to the above equation (1), it may be determined that the angle θ1 between the side face a11 of the first prism 022a distal from the second prism 022b and the light emitting surface of the sub-display panel, satisfies: θ1<δ=arcsin (1/1.49)≅42° (degree). The angle θ2 between the side face b11 of the second prism 022b distal from the first prism 022a and the light emitting surface of the sub-display panel, satisfies: θ2<δ=arcsin (1/1.49)≅42°. That is, the angle θ1 between the side face a11 of the first prism 022a distal from the second prism 022b and the light emitting surface of the sub-display panel and the angle θ2 between the side face b11 of the second prism 022b distal from the first prism 022a and the light emitting surface of the sub-display panel may be both less than 42°. In order to ensure that the light at the seam 00a may be refracted, the angle θ1 and the angle θ2 may both be 39°.

In the embodiment of the present disclosure, in order to ensure that the refracted light may completely cover the area of the display cover plate 021 corresponding to the seam 00a, a spacing h1 between the edge aa of the first prism 022a proximal to the display cover plate 021 and extending along the first direction X and the display cover plate 021 may be greater than or equal to a first spacing $H_1$, wherein the first spacing $H_1$ may satisfy:

$$H_1 = d_0/(2 \times \tan \alpha 1) \quad \text{equation (2);}$$

where $d_0$ is the length of the seam along the second direction, and α1 satisfies:

$$\alpha 1 = \arcsin[(n1/n2) \times \sin \theta 1_{max}] - \theta 1_{max} \quad \text{equation (3);}$$

$\theta 1_{max}$ is the maximum angle between the side face a11 of the first prism 022a distal from the second prism 022b and the light emitting surface of the sub-display panel, i.e., the maximum incident angle of the light emitted from the first sub-display panel 011 at the side face a11 of the first prism 022a distal from the second prism 022b.

Likewise, a spacing h2 between the second prism 022b and the display cover plate 021 may be greater than or equal to a second spacing $H_2$, wherein the second spacing $H_2$ may satisfy:

$$H_2 = d_0/(2 \times \tan \alpha 2) \quad \text{equation (4);}$$

where α2 satisfies:

$$\alpha 2 = \arcsin[(n1/n2) \times \sin \theta 2_{max}] - \theta 2_{max} \quad \text{equation (5);}$$

$\theta 2_{max}$ is the maximum angle between the side face b11 of the second prism 022b distal from the first prism 022a and the light emitting surface of the sub-display panel, i.e., the maximum incident angle of the light emitted from the second sub-display panel 012 at the side face b11 of the second prism 022b distal from the first prism 022a.

Referring to FIG. 6, according to the law of refraction, it may be seen that: $n1 \times \sin \theta 1_{max} = n2 \times \sin (\alpha 1 + \theta 1_{max})$; $n1 \times \sin \theta 2_{max} = n2 \times \sin (\alpha 2 + \theta 2_{max})$.

Here, $\alpha 1 + \theta 1_{max}$ is a refraction angle formed after the light a1 is refracted by the prism 022, and $\alpha 2 + \theta 2_{max}$ is a refraction angle formed after the light a2 is refracted by the prism 022. Thus, the above equation (3) and equation (5) may be derived.

Illustratively, it is assumed that the maximum angle $\theta 1_{max}$ between the side face a11 of the first prism 022a distal from the second prism 022b and the light emitting surface of the sub-display panel is equal to the maximum angle $\theta 2_{max}$ between the side face b11 of the second prism 022b distal from the first prism 022a and the light emitting surface of the sub-display panel, that is, the maximum incident angle $\theta 1_{max}$ of the light emitted from the first sub-display panel 011 at the side face a11 of the first prism 022a distal from the second prism 022b is equal to the maximum incident angle $\theta 2_{max}$ of the light emitted from the second sub-display panel 012 at the side face b11 of the second prism 022b distal from the first prism 022a, and it is assumed that $\theta 1_{max} = \theta 2_{max} = 39°$, according to the above equation (3), the value of α1 may be calculated as: α1=arcsin[(1.49/1)×sin 39°]−39°≅30.5°, and the value of α2 may be calculated as: α2=arcsin[(1.49/1)×sin 39°]−39°≅30.5°.

By taking the value of a1 into the equation (2), it may be obtained that the first spacing $H_1$ satisfies: $H_1 = d_0/(2 \times \tan 30.5°) \approx 0.85 \times d_0$. By taking the value of α2 into the equation (4), it may be obtained that the second spacing $H_2$ satisfies: $H_2 = d_0/(2 \times \tan 30.5°) \approx 0.85 \times d_0$. That is, the spacing h1 between the edge aa of the first prism 022a proximal to the display cover plate 021 and extending along the first direction X and the display cover plate 021, satisfies: $h1 \geq 0.85 \times d_0$, and the distance h2 between the edge bb of the second prism 022b proximal to the display cover plate 021 and extending along the first direction X and the display cover plate 021 satisfies: $h2 \geq 0.85 \times d_0$.

In the embodiment of the present disclosure, in order to ensure the display effect of the spliced display panel, it may enable total reflection to occur at the side face a12 of the first prism 022a proximal to the second prism 022b, and the side face b12 of the second prism 022b proximal to the first prism 022a. That is, the incident angle of the light at the side face a12 of the first prism 022a proximal to the second prism 022b and the incident angle of the light at the side face b12 of the second prism 022b proximal to the first prism 022a may be made to be both greater than or equal to the first critical angle δ.

The incident angle of the light at the seam 00a on the side face a12 of the first prism 022a proximal to the second prism 022b is equal to the angle β2 between the side face a12 of the first prism 022a proximal to the second prism 022b and the light emitting surface of the sub-display panel. The incident angle of the light at the seam 00a on the side face b12 of the second prism 022b proximal to the first prism 022a is equal to the angle β2 between the side face b12 of the second prism 022b proximal to the first prism 022a and the light emitting surface of the sub-display panel. Therefore, in conjunction with FIG. 3 to FIG. 6, in order to ensure that the light at the seam 00a (i.e., the light b1 and the light b2) is totally reflected at the side face a12 of the first prism 022a proximal to the second prism 022b and the side face b12 of the second prism 022b proximal to the first prism 022a, the angle β1 between the side face a12 of the first prism 022a proximal to the second prism 022b and the light emitting surface of the sub-display panel and the angle β2 between the side face b12 of the second prism 022b proximal to the first prism 022a and the light emitting surface of the sub-display panel may both be greater than equal to the first critical angle δ, that is, β1≥δ, β2≥δ.

Thereby, it may enable that the incident angle of the light at the seam 00a on the side face a12 of the first prism 022a proximal to the second prism 022b and the incident angle of the light at the seam 00a on the side face b12 of the second prism 022b proximal to the first prism 022a are always greater than or equal to the first critical angle δ, such that total reflection may occur on the side face.

It should be noted that, the light, which is totally reflected by the side face a12 of the first prism 022a proximal to the second prism 022b and the side face b12 of the second prism 022b proximal to the first prism 022a, may continue to be totally reflected by the side face a11 of the first prism 022a distal from the second prism 022b and the side face b11 of the second prism 022b distal from the first prism 022a, and is not refracted to the display cover plate 021, such that the interference caused by the totally reflected light to the light incident onto the optical compensation strip 02 from the sub-display panel may be prevented.

In the embodiment of the present disclosure, in order to further ensure that the light is totally reflected at the side face a12 of the first prism 022a proximal to the second prism 022b and the side face b12 of the second prism 022b proximal to the first prism 022a, the angle β1 between the side face a12 of the first prism 022a proximal to the second prism 022b and the light emitting surface of the sub-display panel and the angle β2 between the side face b12 of the second prism 022b proximal to the first prism 022a and the light emitting surface of the sub-display panel are both defined to be 2° to 5° larger than the first critical angle δ.

Illustratively, the angle β1 between the side face a12 of the first prism 022a proximal to the second prism 022b and the light emitting surface of the sub-display panel and the angle β2 between the side face b12 of the second prism 022b proximal to the first prism 022a and the light emitting surface of the sub-display panel may be both greater than or equal to 42°. For example, in order to ensure that the light emitted from the seam 00a may be totally reflected by the optical compensation strip 02, the angle β1 and the angle β2 may both be 45°.

As seen from FIGS. 4 and 6, the side face a12 of the first prism 022a proximal to the second prism 022b and the side face b12 of the second prism 022b proximal to the first prism 022a may be both flat surfaces. The incident angle of the light at the side face a12 of the first prism 022a proximal to the second prism 022b is the angle β1 between the side face a12 of the first prism 022a proximal to the second prism 022b and the light emitting surface of the sub-display panel. The incident angle of the light at the side face b12 of the second prism 022b proximal to the first prism 022a is the angle β2 between the side face b12 of the second prism 022b proximal to the first prism 022a and the light emitting surface of the sub-display panel. The angle β1 and the angle β2 may be equal or unequal, which is not limited in the embodiment of the present disclosure.

As seen from FIGS. 3 and 5, the at least two prisms 022 may also include at least one third prism 022c and at least one fourth prism 022d. That is, the at least two prisms 022 may include one or more third prisms 022c, and one or more fourth prisms 022d. Illustratively, the structure shown in FIG. 3 includes two third prisms 022c and two fourth prisms 022d.

The at least one third prism 022c may be disposed on a side face of the first prism 022a distal from the second prism 022b, and the at least one fourth prism 022d may be disposed on a side face of the second prism 022b distal from the first prism 022a.

The orthographic projection of each of the third prisms 022c on the light emitting surface may be located within the display area 011a of the first sub-display panel 011 of the two adjacent sub-display panels 01, and the each of the third prisms 022c may be configured for refracting the light emitted from the first sub-display panel 011 to the area of the display cover plate 021 corresponding to the seam 00a. The orthographic projection of each of the fourth prisms 022d on the light emitting surface may be located within the display area 012a of the second sub-display panel 012 of the two adjacent sub-display panels 01, and the each of the fourth prisms 022d may be configured for refracting the light emitted from the second sub-display panel 012 to the area of the display cover plate 021 corresponding to the seam 00a.

The third prism 022c and the fourth prism 022d may be disposed to ensure that sufficient light may be refracted from the sub-display panel 01 to the display cover plate 021, to ensure that the light penetrating through the display cover plate 021 may effectively eliminate the seam 00a.

Optionally, in the optical compensation strip according to the embodiment of the present disclosure, the third prism 022c and the fourth prism 022d may not be disposed, and the lighted is refracted only by the side face a11 of the first prism 022a distal from the second prism 022b and the side face b11 of the second prism 022b distal from the first prism 022a, and the refracted light may be offset in a direction proximal to the seam 00a.

Referring to FIGS. 3 and 5, it may also be seen that the side surface of the third prism 022c distal from the first prism 022a and the side face of the fourth prism 022d distal from the second prism 022b may be flat or curved surfaces, which is limited by the embodiments of the present disclosure.

In the embodiment of the present disclosure, in order to ensure that the light emitted from the sub-display panel 01 is refracted from the side face of the third prism 022c distal from the first prism 022a, and the side face of the fourth prism 022d distal from the second prism 022b, it is necessary to ensure that the incident angle of the light emitted from the first sub-display panel 011 on the side face of the third prism 022c distal from the first prism 022a and the incident angle of the light emitted from the second sub-display panel 012 on the side face of the fourth prism 022d distal from the second prism 022b are both less than the first critical angle δ. That is, the angle between the side face of the third prism 022c distal from the first prism 022a and the light emitting surface of the sub-display panel, and the angle between the side face of the fourth prism 022d distal from the second prism 022b and the light emitting surface of the sub-display panel are both less than the first critical angle δ.

Figure 7:
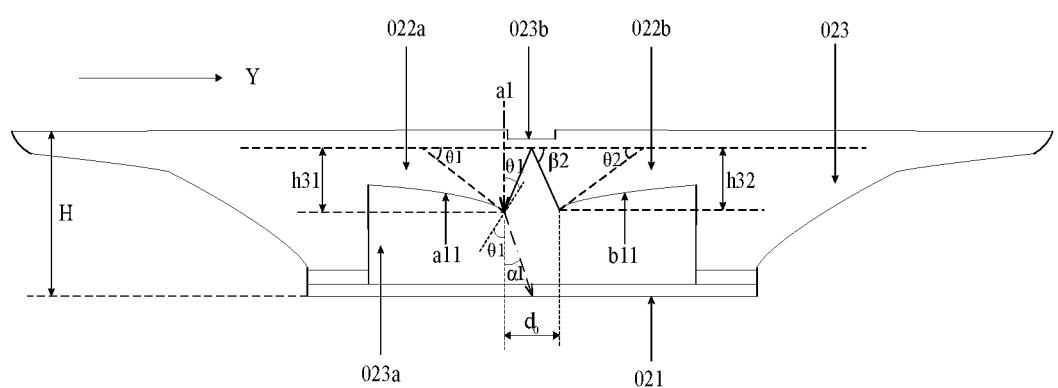
FIG. 7 is a schematic structural diagram of still another optical compensation strip according to an embodiment of the present disclosure.

FIG. 7 is a schematic diagram of structure of still another optical compensation strip according to an embodiment of the present disclosure. As seen from FIG. 7, it may be seen that the plurality of prisms 022 include a first prism 022a and a second prism 022b proximal to each other. The side surface a11 of the first prism 022a distal from the second prism 022b and the side surface b11 of the second prism 022b distal from the first prism 022a are curved surfaces.

Referring to FIGS. 3, 5 and 7, according to the angle β1 between the side face a12 of the first prism 022a proximal to the second prism 022b and the light emitting surface of the sub-display panel, it may be determined that the thickness h31 of the first prism 022a may satisfy:

$$h31 = (d_0/2) \times \tan \beta 1 \qquad \text{equation (6).}$$

Likewise, according to the angle β2 between the side surface b12 of the second prism 022b proximal to the first prism 022a and the light emitting surface of the sub-display panel, it may be determined that the thickness h32 of the second prism 0223 may satisfy:

$$h32 = (d_0/2) \times \tan \beta 2 \qquad \text{equation (7);}$$

wherein the angle β1 between the side face a12 of the first prism 022a proximal to the second prism 022b and the light emitting surface of the sub-display panel may be equal to the angle β2 between the side surface b12 of the second prism 022b proximal to the first prism 022a and the light emitting surface of the sub-display panel. Correspondingly, the thickness h31 of the first prism 022a may be equal to the thickness h32 of the second prism 022b.

Illustratively, assuming that the angle β1 and the angle β2 are both 45°, according to the equation (4) and the equation (5), then it may be determined that the thickness h31 of the first prism 022a is: $h31=(d_0/2)=0.5 \times d_0$, and the thickness h32 of the second prism 022b is: $h32=d_0/2=0.5 \times d_0$.

In the embodiment of the present disclosure, it is assumed that the spacing h1 between the edge aa of the first prism 022a proximal to the display cover plate 021 and extending along the first direction X and the display cover plate 021 is equal to the spacing h2 between the edge bb of the second prism 022b proximal to the display cover plate 021 and extending along the first direction X and the display cover plate 021. Also, the thickness h31 of the first prism 022a is equal to the thickness h32 of the second prism 022b. Then, the thickness H of the optical compensation strip 02 may satisfy: H>h1+h31.

According to the above calculation, it may be determined that $h1 \geq 0.85 \times d_0$, $h31=(d_0/2)=0.5 \times d_0$. Assuming that the value of h1 is: $h1=0.85 \times d_0$, then the thickness H of the optical compensation strip 02 satisfies: $H>1.35 \times d_0$. In consideration of the thickness margin of the display cover plate 021, the thickness H of the optical compensation strip 02 may satisfy: $H<1.5 \times d_0$. Optionally, in the embodiment of the present disclosure, the length of the optical compensation strip 02 along the second direction Y (i.e., the width of the optical compensation strip 02) may be six times the length of the seam 00a along the second direction Y. That is, the thickness of the optical compensation strip 02 according to the embodiment of the disclosure is thin, which avoids the problem of heavy weight.

Figure 8:
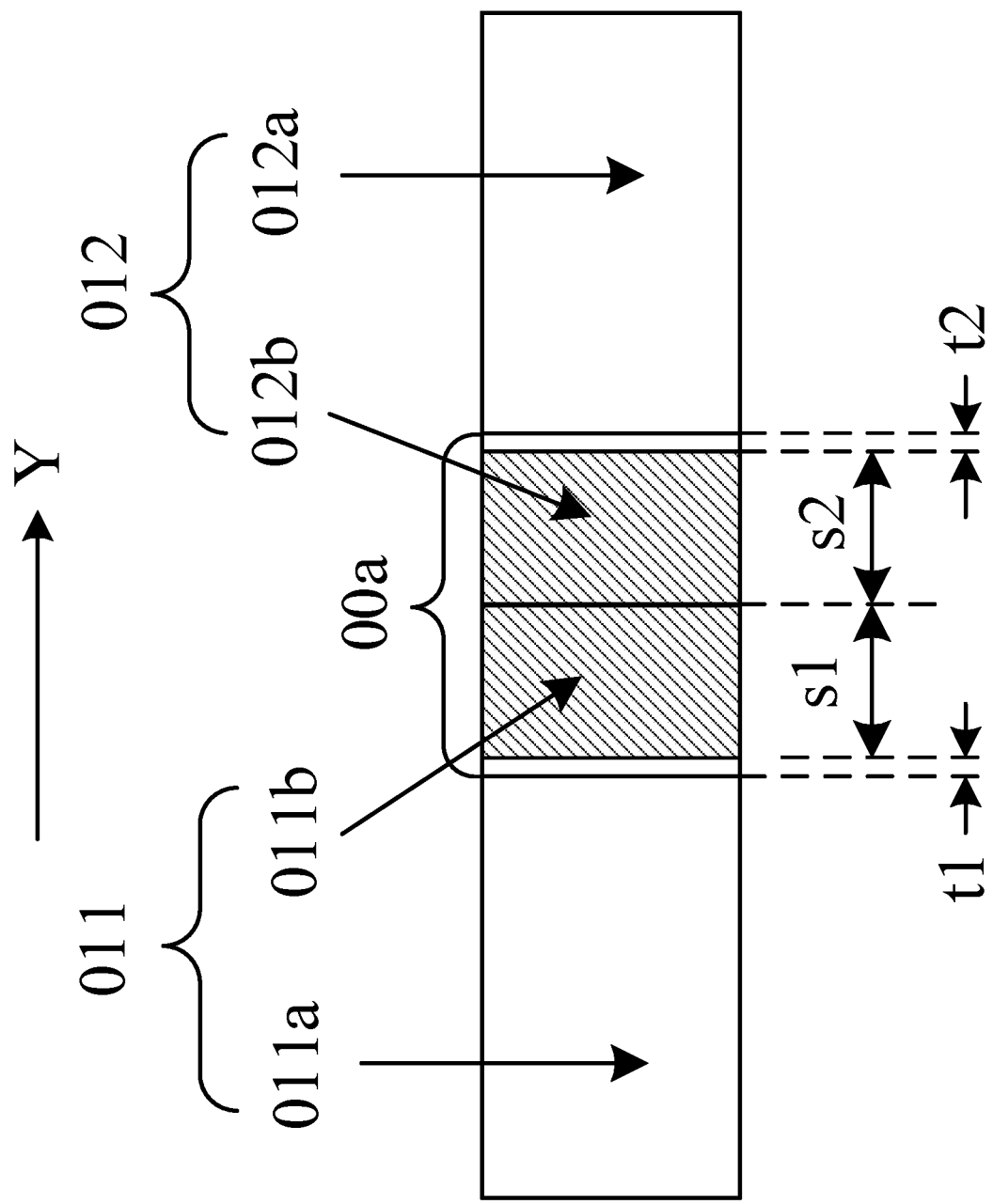
FIG. 8 is a partially enlarged schematic structural diagram of the spliced display panel shown in FIG. 1.

FIG. 8 is a schematic diagram of partially enlarged structure of the spliced display panel shown in FIG. 1. Referring to FIG. 8, a first frame length of the frame 011b at the seam of the first sub-display panel 011 of the two adjacent sub-display panels 01 in a second direction Y may be s1, i.e., the width of the frame 011b may be s1. A second frame length of the frame 012b at the seam of the second sub-display panel 012 of the two adjacent sub-display panels 01 in a second direction Y may be s2, i.e., the width of the frame 012b may be s2. The difference between a sum of a first frame length s1 and a second frame length s2 and the length $d_0$ of the second groove 023b along the second direction Y may be less than the threshold E. That is, the difference between the sum of the lengths (s1+s2) and the length of the second groove 023b in the second direction Y may be small. For example, the threshold E may be 0.1 mm (millimeter). It may also be understood as that: the sum of the widths of the frames at the seam of the two adjacent sub-display panels 01 is approximately equal to the width of the second recess 023b.

In the embodiment of the present disclosure, Referring to FIG. 7, the length of the seam 00a between the two adjacent sub-display panels 01 in the second direction Y may be equal to: a sum of a first frame length s1 of the frame 011b of the first sub-display panel 011 in a second direction Y, a second frame length s2 of the frame 012b of the second sub-display panel 012 in a second direction Y, a length t1 of the non-display area at the seam of the first sub-display panel 011 along the second direction Y, and a length t2 of the non-display area at the seam of the second sub-display panel 012 along the second direction Y. That is, the length $d_0$ of the seam 00a along the second direction Y may satisfy: $d_0=s1+s2+t1+t2$.

Referring to FIGS. 1, 3, 5 and 7, it may be seen that the length of the side of the prism substrate 023 proximal to the display cover plate 021 in the second direction Y may be less than the length of the side of the prism substrate 023 distal from the display cover plate 021 in the second direction Y. The length of the display cover plate 021 in the second direction Y may be equal to the length of the side of the prism substrate 023 proximal to the display cover plate 021 in the second direction Y. Since both the prism substrate 023 and the display cover plate 021 extend along the first direction X, the length of the prism substrate 023 along the second direction Y may refer to the width of the prism substrate 023. Likewise, the length of the display cover plate 021 along second direction Y may refer to the width of the display cover plate 021.

Optionally, the cross section of the prism substrate 023 may be of a trapezoidal structure, and the short side of the trapezoidal structure may be a side proximal to the display cover plate 021, and the long side of the trapezoidal structure may be a side proximal to the sub-display panel. The cross section may be a section parallel to the second direction Y and perpendicular to the first direction X.

The cross section of the prism substrate 023 is defined to be a trapezoid such that there may be a transition region between the sub-display panel and the display cover plate in the optical compensation strip, such that a more even transition may be made between an image displayed by the sub-display panel and an image displayed by the display cover plate, to ensure the display effect of the spliced display panel.

Referring to FIG. 7, it may also be seen that the two waists of the trapezoidal structure may be of an arc, and the arc may be convex toward the direction proximal to the groove, such that the structural stability of the optical compensation strip 02 may be improved, and the weight of the optical compensation strip 02 may be reduced. Moreover, when the waist of the trapezoidal structure is an arc, the transition between the image displayed by the display cover plate and the image displayed by the sub-display panel may be made smoother, and the display effect is better. Nevertheless, the waist of the trapezoidal structure may also be a straight line, which is not limited in the embodiment of the present disclosure.

In the embodiment of the present disclosure, the prism substrate 023 and the display cover plate 021 may be bonded and fixed by an optical adhesive. The optical adhesive may be an optically clear adhesive (OCA) optical adhesive, and the OCA has a high transmittance and a strong adhesion. Moreover, after being bonded by the OCA, the optical compensation strip 02 may be a whole, which facilitates transportation and mounting. Alternatively, the prism substrate 023 and the display cover plate 021 may be of an integrated structure.

Optionally, the material of the display cover plate 021 may include any one of a copolymer of methyl methacrylate and styrene, polycarbonate, polymethyl methacrylate and ground glass or a composition consisting of at least two of the above materials. The material of the prism 022 may include: any one of a copolymer of methyl methacrylate and styrene, polycarbonate, polymethyl methacrylate and ground glass or a composition consisting of at least two of the above materials. The material of the prism substrate 023 may include: any one of a copolymer of methyl methacrylate and styrene, polycarbonate, polymethyl methacrylate and ground glass or a composition consisting of at least two of the above materials. These materials have a transmittance of 90% or more and a refractive index of 1.49 to 1.59, which is similar to the refractive index of the sub-display panel 01, and is easy to process and to form a shape by extrusion.

Illustratively, the display cover plate 021 may be a cover plate after roughness process, for example, the display cover plate 021 may be ground glass, that is, the display cover plate 021 has a high surface roughness. Alternatively, the display cover plate 021 may also be a gain screen. Thereby, the display effect of the display cover plate 021 may be improved, wherein the gain screen may refer to a display screen with higher luminance and higher transmittance.

Optionally, in the display cover plate 021, the area where the orthographic projection of the prism 022 on the display cover plate 021 is located may be roughened, and the area of the display cover plate 021 proximal to the prism substrate 023 may not be roughened. Nevertheless, the entire area of the display cover plate 021 may be roughened, which is not limited in the embodiment of the present disclosure.

Optionally, the surface roughness of the area of the prism substrate 023 in contact with the sub-display panel 01 may be greater than a roughness threshold. That is, the surface roughness of the area of the prism substrate 023 in contact with the sub-display panel 01 is high, thereby ensuring that image distortion does not occur in the area, and the display effect of the spliced display panel is improved.

In the embodiment of the present disclosure, one end of the optical compensation strip 02 may be a tip, and the angle of the tip is positively correlated with the length of the seam 00a in the second direction Y (i.e., the width of the seam 00a).

Figure 9:
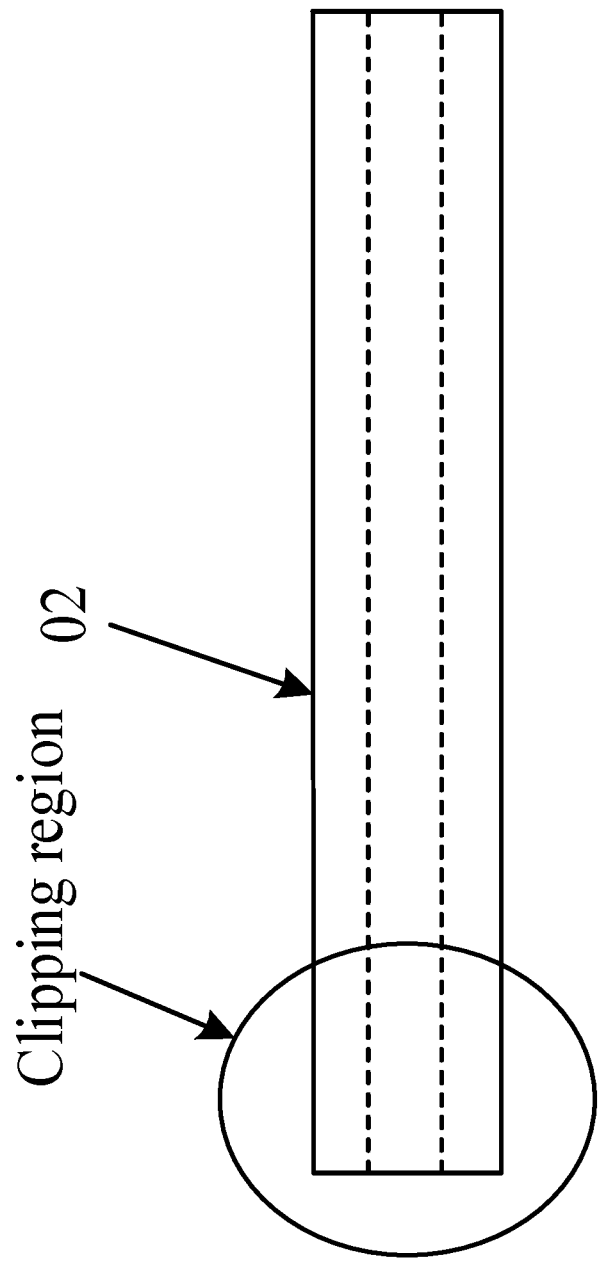
FIG. 9 is a plan view of an optical compensation strip according to an embodiment of the present disclosure.
Figure 10:
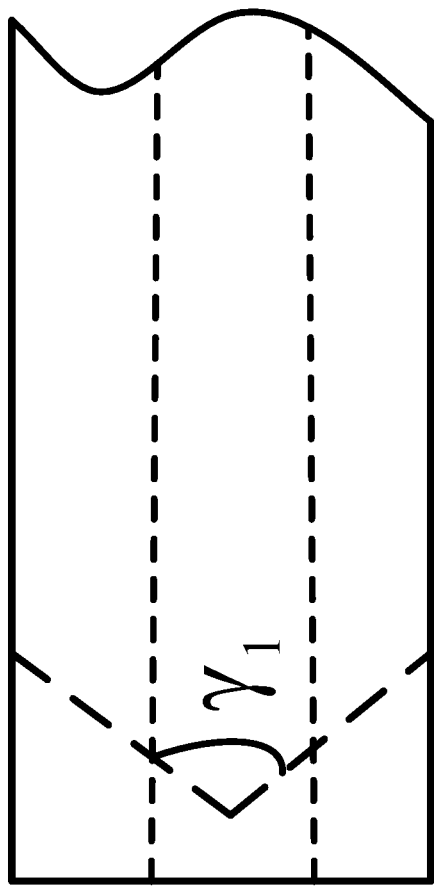
FIG. 10 is a schematic diagram of cutting of an optical compensation strip according to an embodiment of the present disclosure.
Figure 11:
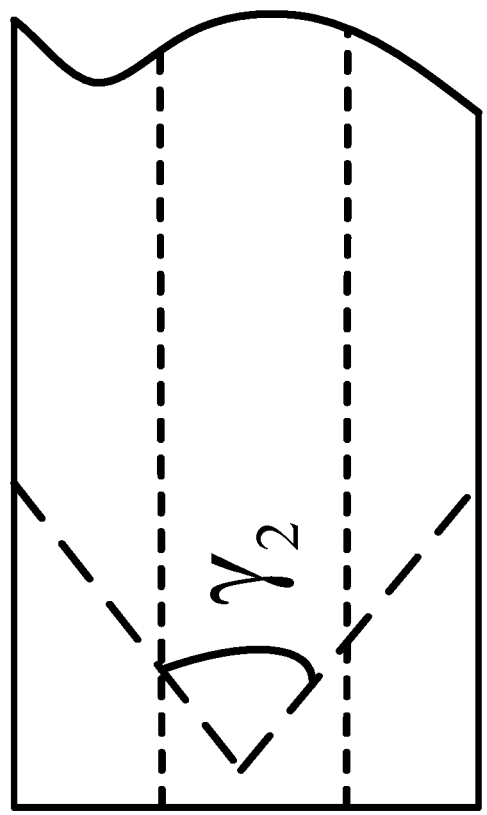
FIG. 11 is a schematic diagram of cutting of an optical compensation strip according to an embodiment of the present disclosure.
Figure 12:
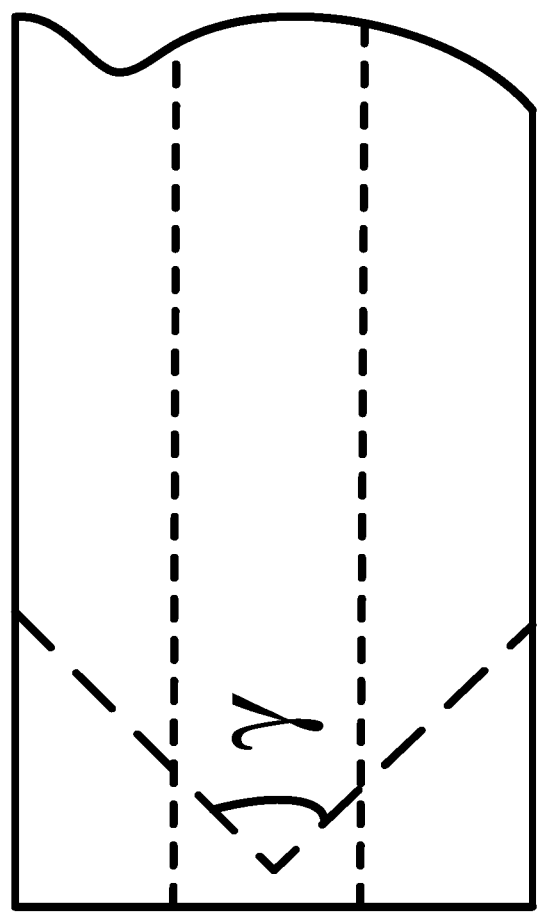
FIG. 12 is a schematic diagram of cutting of an optical compensation strip according to an embodiment of the present disclosure.

When the optical compensation strip 02 is manufactured, one end of the optical compensation strip 02 may be cut into a tip. FIG. 9 is a plan view of an optical compensation strip according to an embodiment of the present disclosure. FIG. 10 is a schematic diagram of cutting of an optical compensation strip according to an embodiment of the present disclosure. As seen from FIG. 10, the angle γ1 of the cut tip may be an obtuse angle. FIG. 11 is schematic diagram of cutting of an optical compensation strip according to an embodiment of the present disclosure. As seen from FIG. 11, the angle γ2 of the cut tip may be an acute angle. FIG. 12 is a schematic diagram of cutting of an optical compensation strip according to an embodiment of the present disclosure. As seen from FIG. 12, the angle γ of the cut tip may also be a right angle. That is, $\gamma_1 > \gamma > \gamma_2$.

Figure 13:
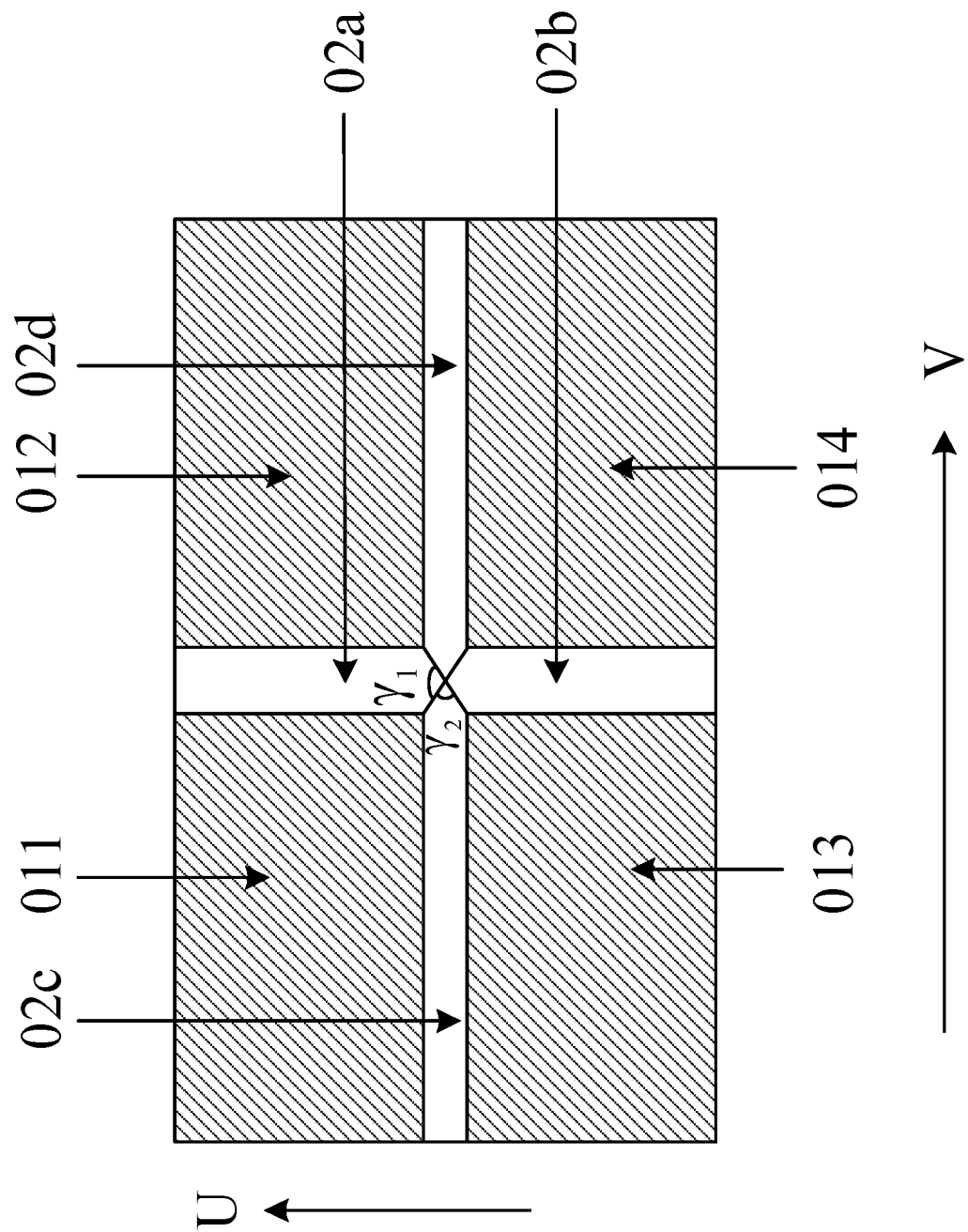
FIG. 13 is a schematic structural diagram of another spliced display panel according to an embodiment of the present disclosure.

FIG. 13 is a schematic structural diagram of another spliced display panel according to an embodiment of the present disclosure. As seen from FIG. 13, the spliced display panel may include four sub-display panels 011, 012, 013, and 014, and four optical compensation strips 02a, 02b, 02c, and 02d. The first optical compensation strip 02a is located at the seam between the first sub-display panel 011 and the second sub-display panel 012, and the second optical compensation strip 02b is located at the seam between the third sub-display panel 013 and the fourth sub-display panel 014. The third optical compensation strip 02c is located at the seam between the first sub-display panel 011 and the third sub-display panel 013, and the fourth optical compensation strip 02d is located at the seam between the second sub-display panel 012 and the fourth sub-display panel 014.

Referring to FIG. 13, it may be seen that the spliced display panel may be spliced by four sub-display panels 01, and there are four seams in the spliced display panel. If an extending direction of the longer side of the spliced display panel is defined as a lengthwise direction V, and an extending direction of the shorter side is defined as a widthwise direction U, extending directions of two of the four seams of the spliced display panel and the optical compensation strips covering the two seams are parallel to the lengthwise direction V, and extending directions of the other two seams and the optical compensation strips covering the two seams are parallel to the widthwise direction U.

Illustratively, referring to FIG. 13, the extending directions of the seam between the first sub-display panel 011 and the second sub-display panel 012 and the first optical compensation strip 02a covering the seam are both parallel to the widthwise direction U. The extending directions of the seam between the third sub-display panel 013 and the fourth sub-display panel 014 and the second optical compensation strip 02b covering the seam are both parallel to the widthwise direction U. That is, for the first optical compensation strip 02a and the second optical compensation strip 02b, the first direction X is parallel to the widthwise direction U, and the second direction Y is parallel to the lengthwise direction V.

The extending directions of the seam between the first sub-display panel 011 and the third sub-display panel 013 and the third optical compensation strip 02c covering the seam are both parallel to the lengthwise direction V. The extending directions of the seam between the second sub-display panel 012 and the fourth sub-display panel 014 and the fourth optical compensation strip 02d covering the seam are both parallel to the lengthwise direction V. That is, for the third optical compensation strip 02c and the fourth optical compensation strip 02d, the first direction X is parallel to the lengthwise direction V, and the second direction Y is parallel to the widthwise direction U.

Referring to FIG. 13, it may be seen that the length of the seam between the first sub-display panel 011 and the second sub-display panel 012 along the lengthwise direction V is equal to the length of the seam between the third sub-display panel 013 and the fourth sub-display panel 014 along the lengthwise direction V. The length of the seam between the first sub-display panel 011 and the third sub-display panel 013 along the widthwise direction U is equal to the length of the seam between the second sub-display panel 012 and the fourth sub-display panel 014 along the widthwise direction U. Moreover, the length of the seam between the first sub-display panel 011 and the second sub-display panel 012 along the lengthwise direction V is greater than the length of the seam between the first sub-display panel 011 and the third sub-display panel 013 along the widthwise direction U.

Therefore, the length of the first optical compensation strip 02a along the lengthwise direction V may be equal to the length of the second optical compensation strip 02b along the lengthwise direction V, the length of the third optical compensation strip 02c along the lengthwise direction V may be equal to the length of the fourth optical compensation strip 02d along widthwise direction U, and the length of the first optical compensation strip 02a along the lengthwise direction V is greater than the length of the third optical compensation strip 02c along the widthwise direction U. Correspondingly, the angle between the tips of the first optical compensation strip 02a may be equal to the angle between the tips of the second optical compensation strip 02b, the angle between the tips of the third optical compensation strip 02c may be equal to the angle between the tips of the fourth optical compensation strip 02d, and the angle $\gamma_1$ between the tips of the first optical compensation strip 02a is greater than the angle $\gamma_2$ between the tips of the third optical compensation strip 02c.

Illustratively, the first optical compensation strip 02a and the second optical compensation strip 02b may be cut by the cutting fashion of the optical compensation strip shown in FIG. 10. The third optical compensation strip 02c and the fourth optical compensation strip 02d may be cut by the cutting fashion shown in FIG. 11.

Nevertheless, the lengths of the seams 00a between any two adjacent sub-display panels 01 of the spliced display panel in the second direction may also be equal. Correspondingly, the angle γ between the tips of each optical compensation strip 02 in the spliced display panel may be 90°. That is, each optical compensation strip 02 may be cut in the fashion shown in FIG. 12.

By cutting the optical compensation strip 02 according to the length of the seam between adjacent sub-display panels in the second direction, it may be ensured that when a plurality of optical compensation strips 02 are included in the spliced display panel, the adjacent optical compensation strips 02 may be accurately spliced together, to ensure that the seams between the sub-display panels may be effectively eliminated.

It should be noted that the light emitting surfaces described in the embodiments of the present disclosure all refer to the light emitting surfaces of the sub-display panel in the spliced display panel, and the light emitting surfaces of the respective sub-display panels in the spliced display panel may be coplanar.

In summary, the embodiments of the present disclosure provide an optical compensation strip, which may be applied to a spliced display panel. Each optical compensation strip includes a display cover plate and at least two prisms disposed opposite to the display cover plate. There is a gap between each prism and the display cover plate. The at least two prisms are configured for refracting light emitted by two adjacent sub-display panels to an area of the display cover plate corresponding to the seam, such that the area of the display cover plate corresponding to the seam may also display an image, thereby achieving the effect of eliminating the seams. Moreover, when the spliced display panel is assembled, the optical compensation strip only needs to be labeled onto the seam between the two adjacent sub-display panels, which facilitates the mounting and lowers the cost.

The embodiment of the present disclosure provides a spliced display device, which may include: at least two sub-display panels 01 and at least one optical compensation strip 02 according to the above embodiment. Each optical compensation strip 02 may be located on the light emitting surface of two adjacent sub-display panels 01 and covers the seam between two adjacent sub-display panels 01.

The embodiment of the present disclosure further provides a display device, which may include: the spliced display panel according to the above embodiment and at least two backlight modules having a one-to-one correspondence with the at least two sub-display panels 01 of the spliced display panel. Each backlight module may be located on a light incident surface of the sub-display panel 01 corresponding thereto. For example, the display device may include an optical compensation strip 02 as shown in any of FIGS. 2-7.

Optionally, each backlight module in the display device may be a direct type backlight module. The light source in the direct-type backlight module is disposed at the bottom of the light guide plate.

Figure 14:
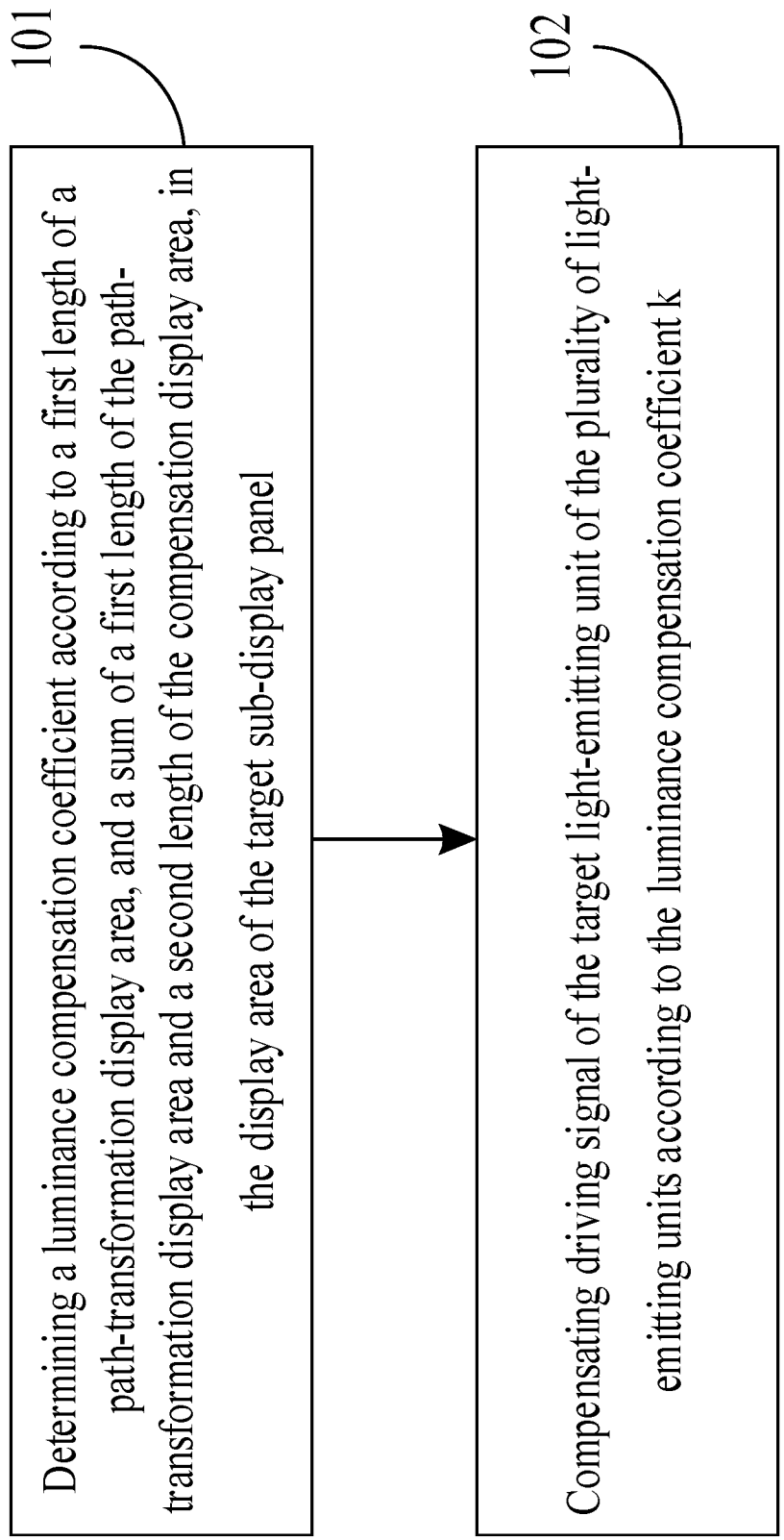
FIG. 14 is a flowchart of a driving method of a backlight module according to an embodiment of the present disclosure.

FIG. 14 is a flowchart of a driving method of a backlight module according to an embodiment of the present disclosure. The driving method may be configured to drive a backlight module in the display device, and the optical compensation strip in the display device may be an optical compensation strip as shown in any of FIGS. 2 to 7. The backlight module is disposed on the light incident surface of the target sub-display panel and is a direct type backlight module, and the light source of the backlight module may include a plurality of light-emitting units. The driving method may be applied to a driving device for a backlight module. Referring to FIG. 14, the method may include the following steps:

Step 101: A luminance compensation coefficient is determined according to a first length of a path-transformation display area, and a sum of a first length of the path-transformation display area and a second length of the compensation display area, in the display area of the target sub-display panel.

The luminance compensation coefficient may be greater than one, and is negatively correlated with the first length and positively correlated with the sum of the lengths; the path-transformation display area is an area of the display area covered by orthographic projections of at least two prisms of the target optical compensation strip, i.e., an area where the light emitted from the display area is refracted by the target optical compensation strip, and the path-transformation display area may extend along the first direction; the compensation display area is an area of the target optical compensation strip covering the seam, i.e., the light incident onto the compensation display area of the optical compensation strip may be totally reflected by the target optical compensation strip, and the compensation display area may extend along the first direction.

The first length may be a length of the path-transformation display area in a second direction Y, the second length may be a length of the compensation display area in the second direction; the target optical compensation strip is disposed on a light emitting surface of the target sub-display panel and extends along the first direction, the second direction may be perpendicular to the first direction, and the first direction and the second direction are both parallel to the light emitting surface.

Optionally, the luminance compensation coefficient may be a ratio of a sum of the lengths to the first length.

Figure 15:
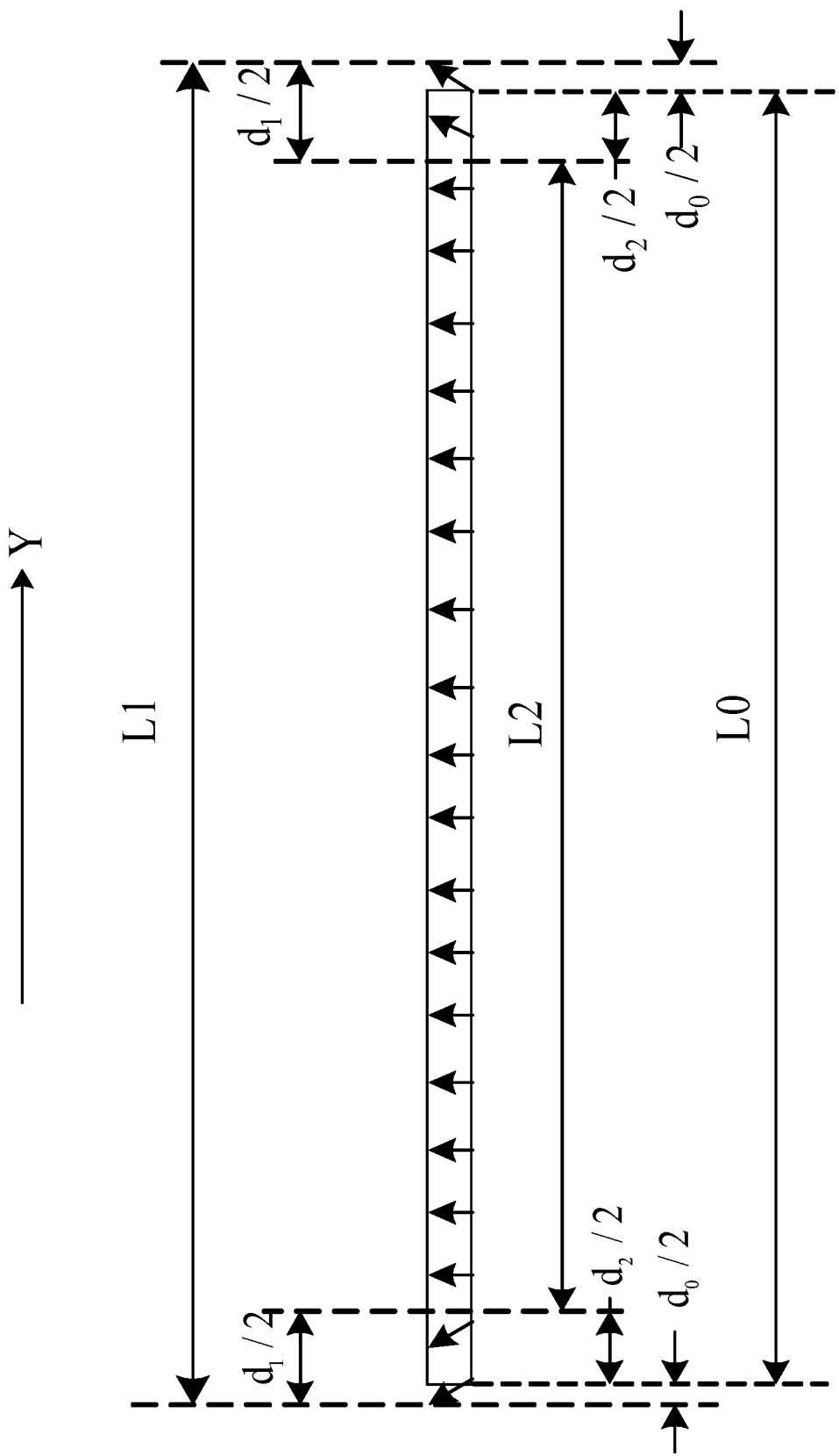
FIG. 15 is a schematic structural diagram of a target sub-display panel according to an embodiment of the present disclosure.

FIG. 15 is a schematic structural diagram of a target sub-display panel according to an embodiment of the present disclosure. Referring to FIG. 15, it is assumed that the length of the display area of the target sub-display panel in the second direction is L0. The display area may be divided into a normal display area and a path-transformation display area. The normal display area may refer to an area in the display area of the target sub-display panel that is not covered by the orthographic projections of at least two prisms of the target optical compensation strip, that is, an area where the light emitted from the display area of the target sub-display panel is not refracted by at least two prisms of the target optical compensation strip. Referring to FIG. 15, the length of the normal display area in the second direction is L2. The path-transformation display area may refer to an area of the display area of the target sub-display panel that is covered by the orthographic projections of at least two prisms of the target optical compensation strip, that is, an area where the light emitted from the display area of the target sub-display panel is refracted by at least two prisms of the target optical compensation strip.

Illustratively, in the structure shown in FIGS. 3 and 5, assuming that the target sub-display panel is the first sub-display panel 011, then the path-transformation display area of the first sub-display panel 011 may include: an area where the orthographic projections of the side surface a11 of the first prism 022a distal from the second prism 022b in the optical compensation strip 02 and the third prism 022c on the light emitting surface are located.

Referring to FIG. 15, it may be seen that the sum of the length L0 of the display area of the target sub-display panel in the second direction and the length of the compensation display area in the second direction is L1. That is, after the seam between the target sub-display panel and the adjacent sub-display panel is eliminated by the target optical compensation strip, the length of the area that may display an image actually in the second direction is L1.

Illustratively, referring to FIG. 15, it is assumed that the light emitting surface of the target sub-display panel is provided with two target optical compensation strips, and the first direction of each target optical compensation strip is parallel to the widthwise direction U of the target sub-display panel. The display area of the target sub-display panel may include two path-transformation display areas extending along the first direction, and a compensation display area extending along the first direction is formed on each side face of the display area. Assuming that the lengths of the two path-transformation display areas in the second direction are equal, both of which are $d_2/2$, then the total length of the path-transformation display area of the target sub-display panel in the second direction is $d_2$.

The lengths of the compensation display areas of the optical compensation strip in the second direction are equal, both of which are $d_0/2$, and the total length of the compensation display area of the optical compensation strip in the second direction is $d_0$. The sum of the total length $d_0$ of the compensation display area and the total length $d_2$ of the path-transformation display area is $d_1$. According to the above analysis, it may be determined that the length L1 of the target sub-display panel satisfies: L1=L0+$d_0$=L2+$d_1$=L2+$d_0$+$d_2$ and the length L0 of the display area of the target sub-display panel satisfies: L0=L2+$d_2$.

In combination with FIGS. 3, 5 and 7, it may be seen that $d_0$ is the length of the seam 00a of the spliced display panel in the second direction.

It is assumed that the total number of pixels of the image displayed in the target sub-display panel is Total. After the seam between the target sub-display panel and its adjacent sub-display panel is eliminated, the area that displays an image in the target sub-display panel will be increased, and thus the pixel density of the image displayed in the sub-display panel will change accordingly.

When the seam of the spliced display panel is not eliminated, the area that displays an image in the target sub-display panel includes: a normal display area and a path-transformation display area (i.e., a display area of the target sub-display panel). In this case, the area where the target sub-display panel actually displays the image is the display area. The length of the display area is L0, and the pixel density p0 of the image displayed by the target sub-display panel may be expressed as: p0=Total/L0.

After the seam of the spliced display panel is eliminated by the optical compensation strip according to the embodiment of the present disclosure, since the area of the optical compensation strip covering the seam may also display an image, the combined area that displays an image of the target sub-display panel and the target optical compensation strip may include: a normal display area and a path-transformation display area of the target sub-display panel, and a compensation display area of the target optical compensation strip.

The compensation display area of the optical compensation strip is an area of the optical compensation strip covering the seam. The image displayed in the path-transformation display area of the target sub-display panel needs to be displayed after being refracted by the optical compensation strip. In this case, the length of the combined area actually displaying the image of the target sub-display panel and the optical compensation strip in the second direction Y is L1. In order to display the image normally in the combined area of the length L1, the pixel density of the image in the path-transformation display area and the normal display area needs to be adjusted, such that after the pixel density is adjusted, the pixel density p1 of the image displayed by the combined area is an average of the total number Total of pixels on the length L1, that is, the pixel density p1 of the image displayed by the combined area is expressed as: p1=Total/L1.

Since the light emitted from the normal display area is not refracted after the seam is eliminated by the target optical compensation strip, the pixel density p2 of the image displayed in the normal display area may satisfy: p2=p1=Total/L1=(p0×L0)/L1. Correspondingly, the first scaling factor k1 of the normal display area may be written as: k1=p0/p2.

Assuming that the pixel density of the image displayed in the path-transformation display area is p3 after the seam is eliminated, then the second scaling factor k2 of the path-transformation display area may be written as: k2=p0/p3.

Since the total numbers Totals of pixels of the image displayed in the target sub-display panel are equal before and after the seam is eliminated, it may be derived that:

$$L2 \times p2 + d_2 \times p3 = \text{Total} \qquad \text{equation (6)}.$$

From equation (6), it may be derived that:

$$p3=[(L1-L2)/(L1 \times d_2)] \times \text{Total}$$

Therefore, the first scaling factor k1 may be expressed as: k1=p0/p2=L1/L0, and the second scaling factor k2 may be expressed as: k2=p0/p3=(L1×$d_2$)/[L0×(L1−L2)]=(L1×$d_2$)/(L0×$d_1$).

In the embodiment of the present disclosure, the luminance compensation coefficient k may be a ratio of the first scaling factor k1 of the normal display area to the second scaling factor k2 of the path-transformation display area, that is, the luminance compensation coefficient k may satisfy: k=k1/k2=$d_1/d_2$. Therefore, the ratio of the sum $d_1$ of the lengths of the path-transformation display area and the compensated display area in the second direction to the length $d_2$ of the path-transformation display area in the second direction may be determined as the luminance compensation coefficient k.

Optionally, the luminance compensation coefficient may also be expressed as: k=k1/k2+ε, where ε may be a difference between a sum of lengths of the frames of the target sub-display panel and its adjacent sub-display panel in the second direction and a length of the second groove along the second direction, that is, ε<E.

It should be noted that, when the target sub-display panel is a sub-display panel at the edge of the spliced display panel, the light emitting surface of the target sub-display panel may be only provided with a target optical compensation strip extending in the first direction. In this case, the display area of the target display panel may include only one path-transformation display area extending in the first direction, and only one side of the path-transformation display area is formed with a compensation display area extending along the first direction. In this way, the luminance compensation coefficient of the target sub-display panel may be calculated according to the length of the path-transformation display area in the second direction and the length of the compensation display area along the second direction. For the calculation process, reference may be made to the foregoing, and details are not described herein again.

Step 102: A driving signal of the target light-emitting unit of the plurality of light-emitting units is compensated according to the luminance compensation coefficient k.

After the driving signal of the target light-emitting unit of the plurality of light-emitting units is compensated according to the luminance compensation coefficient k, the ratio of the signal value of the driving signal of the target light-emitting unit to the signal value of the driving signal of the other light-emitting unit is the luminance compensation coefficient.

The driving signal may be a driving voltage or a driving current. The orthographic projection of the target light-emitting unit on the target sub-display panel is located within the path-transformation display area. Since the luminance compensation coefficient is greater than one, the luminance of the target light-emitting unit is greater than the luminance of the other light-emitting units after the luminance compensation coefficient is configured to compensate for the driving signal of the target light-emitting unit, thereby increasing the luminance of the path-transformation display area, and achieving the luminance compensation for the path-transformation display area.

Since the light emitted from the path-transformation display area of the target sub-display panel will be refracted to the display cover plate, the area of the display cover plate covered by the refracted light is larger than the path-transformation display area, resulting in that the luminance of the display cover plate is lower than the luminance of the normal display area of the target sub-display panel under the same backlight luminance. Therefore, the method according to the embodiment of the present disclosure may ensure that the luminance, contrast, and chrominance of the spliced display panel are consistent and the display effect is better by compensating for the luminance of the path-transformation display area.

In the embodiment of the present disclosure, if the light emitting surface of the target sub-display panel is provided with an optical compensation strip extending along the widthwise direction U of the spliced display panel, and an optical compensation strip extending along the lengthwise direction V of the spliced display panel, the widthwise direction U may be taken as the first direction of the optical compensation strip, to determine the luminance compensation coefficient by the method shown in the above step 101. Moreover, the driving signal of the target light-emitting unit in the backlight module may be compensated by using the determined luminance compensation coefficient. The orthographic projection of the target light-emitting unit on the target sub-display panel is located within the path-transformation display area extending in the widthwise direction U of the target sub-display panel.

Likewise, the lengthwise direction V may be taken as the first direction of the optical compensation strip, to determine the luminance compensation coefficient by the method shown in the above step 101. Moreover, the driving signal of the target light-emitting unit in the backlight module may be compensated by using the determined luminance compensation coefficient. The orthographic projection of the target light-emitting unit on the target sub-display panel is located within the path-transformation display area extending in the lengthwise direction V of the target sub-display panel.

The orthographic projection of other light-emitting unit on the target sub-display panel may be located within a normal display area of the target sub-display panel (i.e., an area where the emitted light is not refracted).

In an embodiment of the present disclosure, the light-emitting unit in the backlight module may be a light emitting diode (LED). Correspondingly, the driving signal may be a driving current, and the signal value of the driving signal may be a current value.

In summary, the embodiment of the present disclosure provides a backlight module driving method, including: determining a luminance compensation coefficient according to a first length of a path-transformation display area, and a sum of a first length of the path-transformation display area and a second length of the compensation display area. By adjusting the driving signal of the target light-emitting unit corresponding to the path-transformation display area of the backlight module by the luminance compensation coefficient, the luminance compensation for the path-transformation display area is achieved, and the luminance uniformity of the spliced display panel is improved, and the display effect of the spliced display panel is better.

Figure 16:
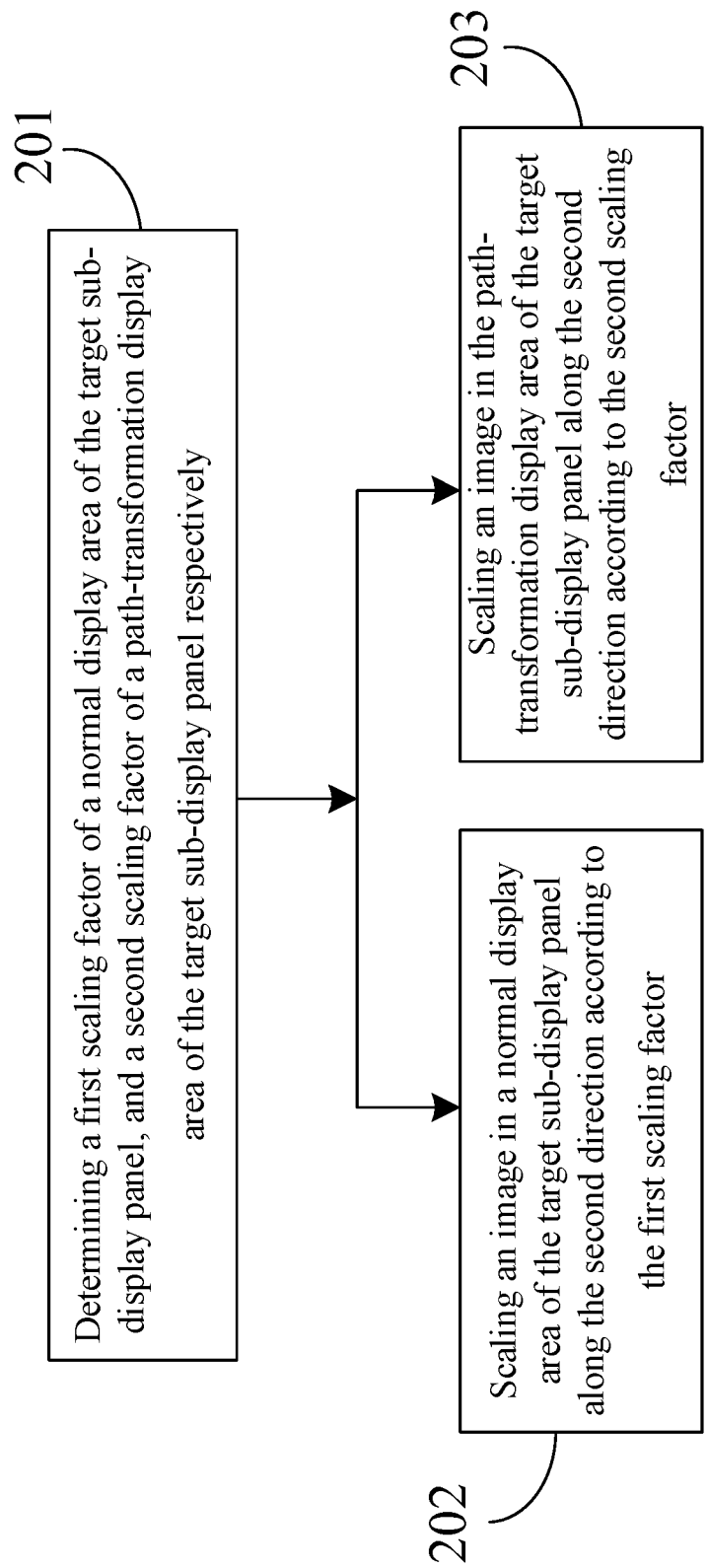
FIG. 16 is a flowchart of a driving method of a sub-display panel according to an embodiment of the present disclosure.

FIG. 16 is a flowchart of a driving method of a sub-display panel according to an embodiment of the present disclosure. The driving method may be configured to drive a target sub-display panel of the spliced display panel as shown in any of FIG. 1, FIG. 8 or FIG. 13, and the light emitting surface of the target sub-display panel may be provided with an optical compensation strip extending in the first direction. The method may be applied to a driving device for a sub-display panel. Referring to FIG. 16, the method may include the following steps:

Step 201: A first scaling factor of a normal display area of the target sub-display panel, and a second scaling factor of a path-transformation display area of the target sub-display panel are determined respectively.

The first scaling factor k1 is positively correlated with a sum of lengths of the normal display area, the path-transformation display area, and the compensation display area of the target optical compensation strip in the second direction, and is negatively correlated with a sum L0 of lengths of the normal display area and the path-transformation display area in the second direction.

The second scaling factor k2 is positively correlated with a sum L1 of lengths of the normal display area, the path-transformation display area, and the compensation display area in the second direction, and a length $d_2$ of the path-transformation display area in the second direction respectively; and is negatively correlated with a sum L0 of lengths of the normal display area and the path-transformation display area in the second direction, and a sum $d_1$ of lengths of the path-transformation display area and the compensation display area in the second direction respectively.

The second direction is perpendicular to the first direction, and the first direction and the second direction are both parallel to the light emitting surface.

The path-transformation display area is an area of a display area of the target sub-display panel covered by orthographic projections of at least two prisms of the target optical compensation strip, i.e., an area where the light emitted from the display area of the path-transformation display area is refracted by the target optical compensation strip. The normal display area is an area of the display area that is not covered by orthographic projections of at least two prisms of the target optical compensation strip, i.e., an area where the light emitted from the display area of the normal display is not refracted by the optical compensation strip. The compensation display area is an area of the target optical compensation strip covering the seam, that is, an area where an orthographic projection of the seam between the target sub-display panel and the adjacent sub-display panel of the target optical compensation strip is located.

Optionally, the first scaling factor k1 may satisfy: k1=L1/L0, and the second scaling factor k2 may satisfy: k2=(L1×$d_2$)/(L0×$d_1$).

It is assumed that the light emitting surface of the target sub-display panel is provided with two target optical compensation strips, and the first direction of each target optical compensation strip is parallel to the widthwise direction U of the target sub-display panel. The display area of the target sub-display panel may include two path-transformation display areas extending along the first direction, and a compensation display area extending along the first direction is formed on each side of the display area. It is assumed that the lengths of the two path-transformation display areas in the second direction are equal, that is, they may both be $d_2/2$, and the lengths of the compensation display areas on both sides of the target sub-display panel in the second direction are equal, that is, both may both be $d_0/2$, the total length of the compensation display area of the target sub-display panel in the second direction is $d_0$. The sum of the total length $d_0$ of the compensation display area in the second direction and the total length $d_2$ of the path-transformation display area in the second direction is $d_1$.

According to the above analysis, it may be determined that the length L1 of the target sub-display panel in the second direction satisfies: L1=L0+$d_0$=L2+$d_1$=L2+$d_0$+$d_2$, and the length L0 of the display area of the target sub-display panel in the second direction satisfies: L0=L2+$d_2$.

It should be noted that, when the target sub-display panel is a sub-display panel at the edge of the spliced display panel, the light emitting surface of the target sub-display panel may be only provided with a target optical compensation strip extending in the first direction. In this case, the display area of the target display panel may include only one path-transformation display area extending in the first direction, and only one side of the path-transformation display area is formed with a compensation display area extending along the first direction.

In this case, the first scaling factor k1 may be calculated according to the length L1 of the area actually displaying an image of the target sub-display panel in the second direction, and the length L0 of the display area of the target sub-display panel in the second direction, wherein L1=L0+$d_0/2$=L2+$d_1/2$=L2+$d_0/2$+$d_2/2$. And the second scaling factor k2 may be calculated according to the length L1 of the area actually displaying an image of the target sub-display panel in the second direction, the length L0 of the display area of the target sub-display panel in the second direction, the sum $d_1/2$ of the total length of the compensation display area of the target sub-display panel in the second direction and the total length of the path-transformation display area in the second direction, and the total length $d_2/2$ of the path-transformation display area of the target sub-display panel in the second direction. For the calculation process, reference may be made to the foregoing, and details are not described herein again.

Step 202: An image in a normal display area of the target sub-display panel is scaled along the second direction according to the first scaling factor.

In an embodiment of the present disclosure, the image in the normal display area of the target sub-display panel may be scaled the first scaling factor k1 times by the driving device in the second direction. Since the first scaling factor k1 is greater than one, the ratio of the length of the scaled image in the second direction to the length of the image in the second direction before scaling is the first scaling factor k1. That is, the driving device enlarges the image of the normal display area of the target sub-display panel according to the first scaling factor k1, thereby avoiding image distortion.

Optionally, the first scaling factor k1 may satisfy: k1=L1/L0, and the image in the normal display area of the target sub-display panel may be scaled L1/L0 times by the driving device in the second direction.

Step 203: An image in the path-transformation display area of the target sub-display panel is scaled along the second direction according to the second scaling factor.

In the embodiment of the present disclosure, the image in the path-transformation display area of the target sub-display panel may be scaled the second scaling factor k2 times by the driving device in the second direction.

Optionally, the second scaling factor k2 may satisfy: k2=(L1×$d_2$) (L0×$d_1$), and the image in the path-transformation display area of the target sub-display panel may be scaled (L1×$d_2$)/(L0×$d_1$) times by the driving device in the second direction.

It should be noted that step 202 and step 203 of the driving method of the sub-display panel according to the embodiment of the present disclosure may be performed synchronously, or step 203 may be performed before step 202, which is not limited in the embodiment of the present disclosure.

In the embodiment of the present disclosure, if the light emitting surface of the target sub-display panel is provided with an optical compensation strip extending in the lengthwise direction V, and an optical compensation strip extending in the widthwise direction U, the driving device may take the widthwise direction U of the target sub-display panel as the first direction, and the first scaling factor and the second scaling factor are determined by the method shown in step 201. And, the image of the normal display area in the target sub-display panel may be scaled along the lengthwise direction V of the target sub-display panel by using the determined first scaling factor, and the image of the path-transformation display area in the target sub-display panel may be scaled along the lengthwise direction V of the target sub-display panel by using the determined second scaling factor.

Likewise, the driving device may also take the lengthwise direction V of the target sub-display panel as the first direction, and the first scaling factor and the second scaling factor may be determined by the method shown in step 201. And, the image of the normal display area in the target sub-display panel may be scaled along the widthwise direction U of the target sub-display panel by using the determined first scaling factor, and the image of the path-transformation display area of the target sub-display panel may be scaled along the widthwise direction U of the target sub-display panel by using the determined second scaling factor.

It is assumed that the spliced display panel includes sub-display panels arranged in M rows and N columns (i.e., include M*N sub-display panels spliced together). If the second direction is the lengthwise direction V of the target sub-display panel, and is the row direction of the spliced display panel, and the first scaling factor k1 and the second scaling factor k2 of each sub-display panel in the second direction are equal. The first total scaling factor $k1_N$ of the image displayed by the spliced display panel along the second direction may be expressed as: $k1_N$=k1×N=(L1/L0)×N, and the second total scaling factor $k2_N$ along the second direction may be expressed as: $k2_N$=k2×N=[(L1/$d_2$)/(L0×$d_1$)]×N.

If the second direction is the widthwise direction U of the target sub-display panel and is the row direction of the spliced display panel, and the first scaling factor k1 and the second scaling factor k2 of each sub-display panel in the second direction are equal. The first total scaling factor $k1_M$ of the image displayed by the spliced display panel along the second direction may be expressed as: $k1_M=k1\times M=(L1/L0)\times M$, and the second total scaling factor $k2_M$ along the second direction may be expressed as: $k2_M=k2\times M=[(L1/d_2)/(L0\times d_1)]\times M$.

In summary, the embodiment of the present disclosure provides a driving method of a sub-display panel. According to the method, a first scaling factor of a normal display area of a target sub-display panel along a second direction, and a second scaling factor of a path-transformation display area of a target sub-display panel along a second direction are determined respectively, the normal display area in the target sub-display panel is scaled by the first scaling factor, and the path-transformation display area in the target sub-display panel is scaled by the second scaling factor. In this way, the distortion of the image displayed in the target sub-display panel is avoided, and the display effect of images displayed by the spliced display panel is improved.

Figure 17:
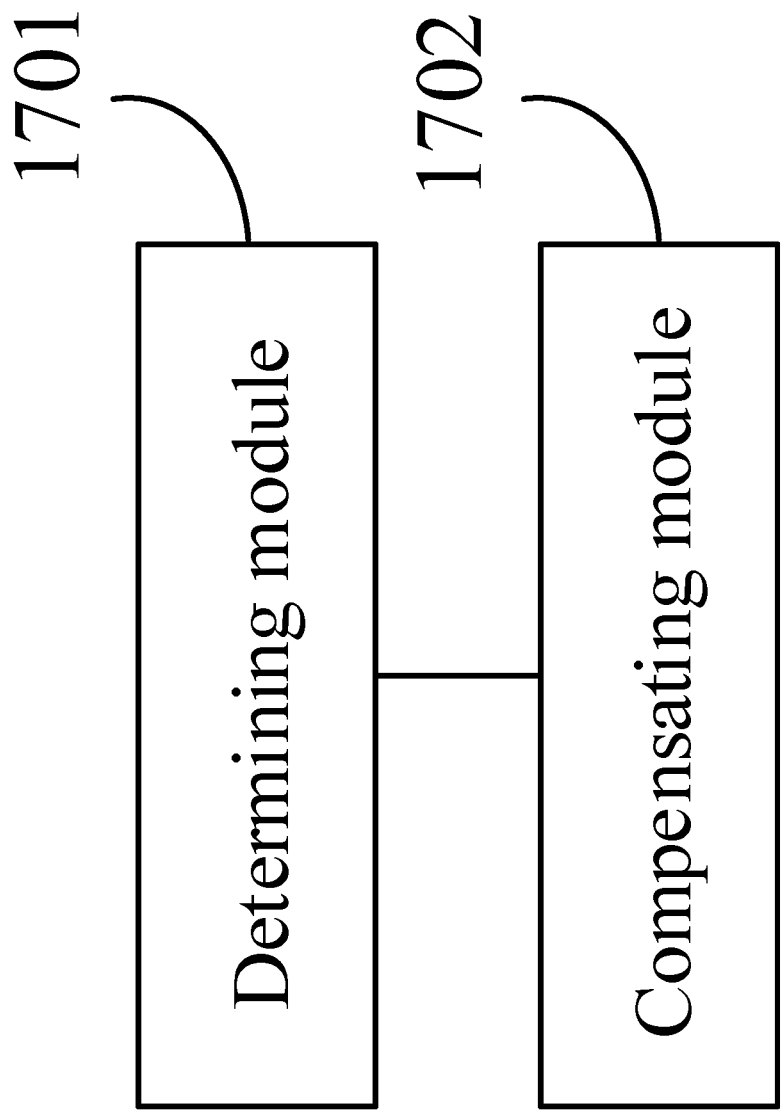
FIG. 17 is a schematic structural diagram of a driving device for a backlight module according to an embodiment of the present disclosure.

The embodiment of the present disclosure further provides a backlight module driving device, which may be configured to drive a backlight module in the display device. The backlight module is disposed on the light incident surface of the target sub-display panel and is a direct type backlight module, and the light source of the backlight module may include a plurality of light-emitting units. As shown in FIG. 17, the device may include:

a determining module 1701, configured to determine a luminance compensation coefficient according to a first length of a path-transformation display area, and a sum of a first length of the path-transformation display area and a second length of the compensation display area, in the display area of the target sub-display panel, wherein the luminance compensation coefficient may be greater than one, and the luminance compensation coefficient may be negatively correlated with the first length and positively correlated with the sum of the lengths;

a compensating module 1702, configured to compensate for a driving signal of a target light-emitting unit of the plurality of light-emitting units according to the luminance compensation coefficient, wherein the orthographic projection of the target light-emitting unit on the target sub-display panel may be located within the path-transformation display area. The path-transformation display area may be an area of the display area covered by the orthographic projections of at least two prisms of the target optical compensation strip, and the compensation display area may be an area of the target optical compensation strip covering the seam, the first length may be a length of the path-transformation display area in a second direction, the second length may be a length of the compensation display area along the second direction, and the target optical compensation strip may be disposed on the light emitting surface of the target sub-display panel and extends along the first direction, the second direction may be perpendicular to the first direction, and the first direction and the second direction may both be parallel to the light emitting surface.

Optionally, the determining module 1701 is configured to determine a ratio of the sum of the lengths to the first length as a luminance compensation coefficient.

Optionally, the compensating module 1702 is configured to adjust a driving signal of the target light-emitting unit such that a ratio of the signal value of the adjusted driving signal of the target light-emitting unit to the signal value of the driving signal of other light-emitting unit is the luminance compensation coefficient.

In summary, the driving device for the backlight module according to the embodiment of the present disclosure may determine the luminance compensation coefficient according to the determining module, and the compensating module may adjust the driving signal of the target light-emitting unit corresponding to the path-transformation display area in the backlight module according to the luminance compensation coefficient. In this way the luminance compensation is implemented for the path-transformation display area, and the luminance uniformity of the spliced display panel is improved. Therefore, the display effect of the spliced display panel is improved.

Figure 18:
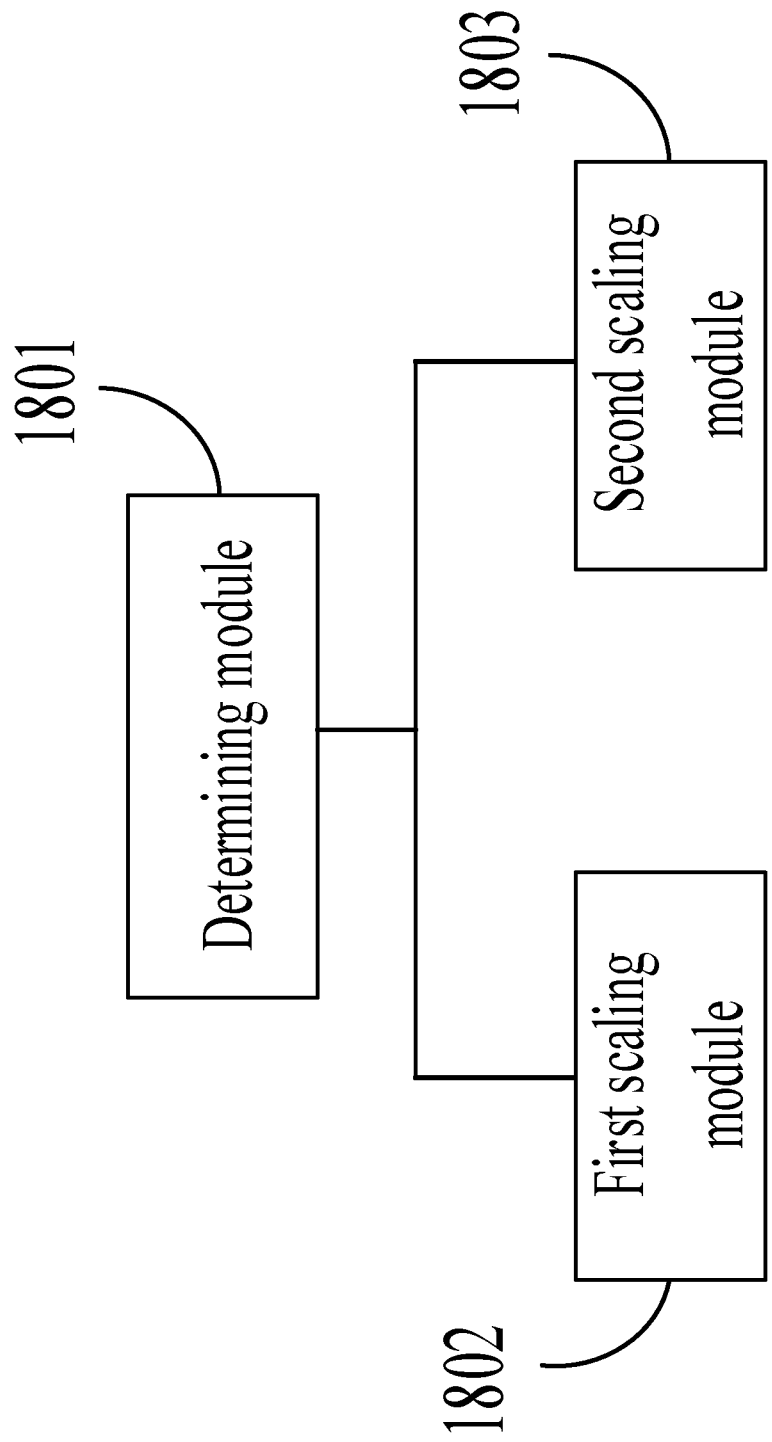
FIG. 18 is a schematic structural diagram of a driving device for a sub-display panel according to an embodiment of the present disclosure.

The embodiment of the present disclosure further provides a driving device for a sub-display panel, wherein the driving device may be configured to drive a target sub-display panel of the spliced display panel, and the light emitting surface of the target sub-display panel may be provided with a target optical compensation strip extending in the first direction. As shown in FIG. 18, the device may include:

a determining module 1801, configured to determine a first scaling factor of a normal display area of the target sub-display panel, and a second scaling factor of a path-transformation display area of the target sub-display panel respectively;

the first scaling factor being positively correlated with a sum of lengths of the normal display area, the path-transformation display area, and the compensation display area of the target optical compensation strip in the second direction, and being negatively correlated with a sum of lengths of the normal display area and the path-transformation display area in the second direction; the second scaling factor being positively correlated with a sum of lengths of the normal display area, the path-transformation display area, and the compensation display area in the second direction, and a length of the path-transformation display area in the second direction respectively; and being negatively correlated with a sum of lengths of the normal display area and the path-transformation display area in the second direction, and a sum of lengths of the path-transformation display area and the compensation display area in the second direction respectively;

wherein the second direction may be perpendicular to the first direction, and the first direction and the second direction are both parallel to the light emitting surface;

a first scaling module 1802, configured to scale an image in a normal display area of the target sub-display panel along the second direction according to the first scaling factor;

a second scaling module 1803, configured to scale an image in a path-transformation display area of the target sub-display panel along the second direction according to the second scaling factor;

wherein the path-transformation display area is an area of the display area covered by orthographic projections of at least two prisms of the target optical compensation strip, the normal display area is an area of the display area that is not covered by orthographic projections of at least two prisms of the target optical compensation strip, and the compensation display area is an area of the target optical compensation strip covering the seam.

Optionally, the first scaling factor $k1$ satisfies:
$$k1=L1/L0;$$

the second scaling factor $k2$ satisfies:
$$k2=(L1 \times d_2)/(L0 \times d_1);$$

where L1 is a sum of lengths of the normal display area, the path-transformation display area, and the compensation display area in the second direction, L0 is a sum of lengths of the normal display area and the path-transformation display area in the second direction, $d_2$ is a length of the path-transformation display area in the second direction, and $d_1$ is a sum of lengths of the path-transformation display area and the compensation display area in the second direction.

In summary, the driving device for the sub-display panel according to the embodiment of the present disclosure may determine the first scaling factor and the second scaling factor according to the determining module, the first scaling module may scale the image of the normal display area of the target sub-display panel according to the first scaling factor, and the second scaling module may scale the image in the path-transformation display area of the target sub-display panel according to the second scaling factor. In this way, the distortion of the image displayed in the target sub-display panel is avoided, and the display effect of images displayed by the spliced display panel is improved.

A person skilled in the art may clearly understand that, for the convenience and brevity of the description, as to the specific working process of the foregoing driving devices and modules, please refer to the corresponding process in the foregoing driving method embodiment, and details are not described herein again.

The embodiment of the present disclosure further provides another driving device, which may include: a processing component, a memory, and a computer program stored on the memory and operable on the processing component, and the processing component may be a processing circuit or a processing unit; when the processing component executes the computer program, the backlight module driving method or the driving method of the sub-display panel provided in the above method embodiments may be implemented.

In the embodiment of the present disclosure, the driving device may be a separately integrated control chip in the display device, or may be integrated on a system on chip (SOC) or a graphics card of the display device.

The embodiment of the present disclosure further provides a computer readable storage medium that stores instructions; when operating on a computer, the computer readable storage medium causes the computer to perform the backlight module driving method or the driving method of the sub-display panel provided in the above method embodiments.

Described above are merely exemplary embodiments of the present disclosure, and are not intended to limit the present disclosure. Within the spirit and principles of the disclosure, any modifications, equivalent substitutions, or improvements are within the protection scope of the present disclosure.

What is claimed is:

1. A driving method of a backlight module, wherein a display device comprises at least two sub-display panels, at least one optical compensation strip, and at least two backlight modules in a one-to-one correspondence with the at least two sub-display panels; wherein each of the at least one optical compensation strip is located on a light emitting surface of two adjacent sub-display panels and covers a seam between the two adjacent sub-display panels; and each of the at least two backlight modules is located at a light incident surface of the sub-display panel corresponding thereto; and each of the at least one optical compensation strip includes: a display cover plate, and at least two prisms disposed opposite to the display cover plate, the display cover plate being fixed on the light emitting surface of the adjacent two sub-display panels, and the at least two prisms being located between the display cover plate and the light emitting surface; wherein a gap is present between each of the prisms and the display cover plate, and each of the prisms, the display cover plate, and the seam all extend along a first direction; and the at least two prisms are configured to refract light emitted from the two adjacent sub-display panels to an area of the display cover plate corresponding to the seam; and wherein the driving method is for driving one of the at least two backlight modules of the display device, the backlight module being disposed on a light incident surface of a target sub-display panel, the backlight module being direct type backlight modules, and the backlight modules comprising a plurality of light-emitting units;

wherein the method comprises:

determining a luminance compensation coefficient according to a first length of a path-transformation display area, and a sum of a first length of the path-transformation display area and a second length of a compensation display area, in the display area of the target sub-display panel, the luminance compensation coefficient being greater than one, and the luminance compensation coefficient being negatively correlated with the first length and positively correlated with the sum of the lengths; and compensating for a driving signal of a target light-emitting unit of the plurality of light-emitting units according to the luminance compensation coefficient, an orthographic projection of the target light-emitting unit at the target sub-display panel being located within the path-transformation display area;

wherein the path-transformation display area is an area of the display area covered by orthographic projections of at least two prisms of the target optical compensation strip and the path-transformation display area extends along a first direction, the compensation display area is an area of the target optical compensation strip covering the seam, and the compensation display area extends along the first direction, the first length is a length of the path-transformation display area in a second direction, the second length is a length of the compensation display area in the second direction, the target optical compensation strip is disposed on a light emitting surface of the target sub-display panel and extends along the first direction, the second direction is perpendicular to the first direction, and the first direction and the second direction are both parallel to the light emitting surface.

2. The driving method according to claim 1, wherein the determining a luminance compensation coefficient according to a first length of a path-transformation display area and a sum of a first length of the path-transformation display area and a second length of the compensation display area in the display area of the target sub-display panel comprises:
  determining a ratio of the sum of the lengths to the first length as the luminance compensation coefficient.

3. The driving method according to claim 1, wherein the compensating for a driving signal of a target light-emitting unit of the plurality of light-emitting units according to the luminance compensation coefficient comprises:
  adjusting a signal value of the driving signal of the target light-emitting unit such that a ratio of the signal value of the adjusted driving signal of the target light-emitting unit to the signal value of the driving signal of other light-emitting unit is the luminance compensation coefficient.

4. A spliced display device, wherein the display device comprises at least two sub-display panels, at least one optical compensation strip, and at least two backlight modules in a one-to-one correspondence with the at least two sub-display panels; and
  each of the at least one optical compensation strip is located on a light emitting surface of two adjacent sub-display panels and covers a seam between the two adjacent sub-display panels; and each of the at least two backlight modules is located at a light incident surface of the sub-display panel corresponding thereto; and
  each of the at least one optical compensation strip includes: a display cover plate, and at least two prisms disposed opposite to the display cover plate, the display cover plate being fixed on the light emitting surface of the adjacent two sub-display panels, and the at least two prisms being located between the display cover plate and the light emitting surface; wherein
  a gap is present between each of the prisms and the display cover plate, and each of the prisms, the display cover plate, and the seam all extend along a first direction; and
  the at least two prisms are configured to refract light emitted from the two adjacent sub-display panels to an area of the display cover plate corresponding to the seam;
  wherein each of the at least two backlight modules is driven by the driving method according to claim 1.

5. The spliced display device according to claim 4, wherein the at least two prisms comprise: a first prism and a second prism that are proximal to each other;
  wherein an orthographic projection of a borderline between the first prism and the second prism on the light emitting surface is collinear with a central axis of the seam, the central axis being parallel to the first direction.

6. The spliced display device according to claim 5, wherein
  an orthographic projection of a side face of the first prism distal from the second prism on the light emitting surface is located within a display area of a first sub-display panel of the two adjacent sub-display panels, for refracting light emitted from the first sub-display panel to an area of the display cover plate corresponding to the seam; and
  an orthographic projection of a side face of the second prism distal from the first prism on the light-existing surface is located within a display area of a second sub-display panel of the two adjacent sub-display panels, for refracting light emitted from the second sub-display panel to the area of the display cover plate corresponding to the seam.

7. The spliced display device according to claim 6, wherein
  a maximum angle between the side face of the first prism distal from the second prism and the light emitting surface, and a maximum angle between the side face of the second prism distal from the first prism and the light emitting surface are both less than a first critical angle $\delta$, the first critical angle $\delta$ satisfying: $\delta=\arcsin(n2/n1)$;
  where n1 is a refractive index of the first prism, and n2 is a refractive index of a medium between the first prism and the display cover plate, the refractive index of the second prism is equal to the refractive index of the first prism, and $0<n2/n1 \leq 1$.

8. The spliced display device according to claim 7, wherein
  a spacing between the first prism and the display cover plate is greater than or equal to a first spacing, the first spacing satisfying: $H_1=d_0/(2 \times \tan \alpha 1)$;
  a spacing between the second prism and the display cover plate is greater than or equal to a second spacing, the second spacing satisfying: $H_2=d_0/(2 \times \tan \alpha 2)$;
  where $d_0$ is a length of the seam in a second direction;

$\alpha 1$ satisfies: $\alpha 1 = \arcsin[(n1/n2) \times \sin \theta 1_{max}] - \theta 1_{max}$;

$\alpha 1$ satisfies: $\alpha 2 = \arcsin[(n1/n2) \times \sin \theta 2_{max}] - \theta 2_{max}$;
  and $\theta 1_{max}$ is the maximum angle between the side face of the first prism distal from the second prism and the light emitting surface, and $\theta 2_{max}$ is the maximum angle between the side face of the second prism distal from the first prism and the light emitting surface; wherein the second direction is perpendicular to the first direction, and the first direction and the second direction are both parallel to the light emitting surface; and $[(n1/n2) \times \sin \theta 1_{max}]$ and $[(n1/n2) \times \sin \theta 2_{max}]$ are both in a range of $[-1$ to $1]$.

9. The spliced display device according to claim 5, wherein
  a side face of the first prism proximal to the second prism, and a side face of the second prism proximal to said first prism are both configured to totally reflect the light at the seam; and
  a difference between a spacing between an edge of the first prism proximal to the display cover plate and extending along the first direction and an edge of the second prism proximal to the display cover plate and extending along the first direction, and a length of the seam in the second direction, is less than a difference threshold;
  wherein the second direction is perpendicular to the first direction, and the first direction and the second direction are both parallel to the light emitting surface.

10. The spliced display device according to claim 9, wherein
  an angle between a side face of the first prism proximal to the second prism and the light emitting surface, and an angle between a side face of the second prism proximal to the first prism and the light emitting surface are both greater than or equal to a first critical angle $\delta$, the first critical angle $\delta$ satisfying: $\delta=\arcsin(n2/n1)$;
  where n1 is a refractive index of the first prism, n2 is a refractive index of a medium between the first prism and the display cover plate; wherein the refractive index of the second prism is equal to the refractive index of the first prism, and $0<n2/n1 \leq 1$.

11. The spliced display device according to claim 5, wherein the at least two prisms further comprise: at least one third prism and at least one fourth prism; wherein
the at least one third prism is disposed on a side of the first prism distal from the second prism, and the at least one fourth prism is disposed on a side of the second prism distal from the first prism;
an orthographic projection of each of the at least one third prism on the light emitting surface is located within a display area of a first sub-display panel of the two adjacent sub-display panels, for refracting light emitted from the first sub-display panel to an area of the display cover plate corresponding to the seam; and
an orthographic projection of each of the at least one fourth prism on the light emitting surface is located within a display area of a second sub-display panel of the two adjacent sub-display panels, for refracting light emitted from the second sub-display panel to an area of the display cover plate corresponding to the seam.

12. The spliced display device according to claim 4, further comprising: a prism substrate; wherein
the prism substrate is fixed on the light emitting surface of the two adjacent sub-display panels, and one side of the prism substrate is in contact with the light emitting surface, and other side of the prism substrate is in contact with the display cover plate;
wherein the other side of the prism substrate that is in contact with the display cover plate is provided with a first groove, the at least two prisms are disposed in the first groove, and the first groove extends along the first direction.

13. The spliced display device according to claim 12, wherein
a side of the prism substrate distal from the display cover plate is provided with a second groove, wherein the second groove extends along the first direction, and an orthographic projection of a central axis of the second groove on the light emitting surface is collinear with a central axis of the seam, the central axis of the second groove and the central axis of the seam being both parallel to the first direction; and
a difference between a sum of lengths of borders at the seam of the adjacent two sub-display panels in a second direction and a length of the second groove in the second direction is less than a threshold;
wherein the second direction is perpendicular to the first direction, and the first direction and the second direction are both parallel to the light emitting surface.

14. The spliced display device according to claim 12, wherein
a length of a side of the prism substrate proximal to the display cover plate in a second direction is less than a length of a side of the prism substrate distal from the display cover plate in the second direction; and
a length of the display cover plate in the second direction is equal to a length of a side of the prism substrate proximal to the display cover plate in the second direction;
wherein the second direction is perpendicular to the first direction, and the first direction and the second direction are both parallel to the light emitting surface.

15. The spliced display device according to claim 12, wherein a surface roughness of a region where the prism substrate is in contact with the sub-display panel is greater than a roughness threshold.

16. The spliced display device according to claim 4, wherein,
one end of the optical compensation strip is a tip, and an angle of the tip is positively correlated with a length of the seam in a second direction; and
the second direction is perpendicular to the first direction, and the first direction and the second direction are both parallel to the light emitting surface.

17. A driving method of a sub-display panel, wherein a display device comprises at least two sub-display panels, at least one optical compensation strip, and at least two backlight modules in a one-to-one correspondence with the at least two sub-display panels; wherein
each of the at least one optical compensation strip is located on a light emitting surface of two adjacent sub-display panels and covers a seam between the two adjacent sub-display panels; and each of the at least two backlight modules is located at a light incident surface of the sub-display panel corresponding thereto; and
each of the at least one optical compensation strip includes: a display cover plate, and at least two prisms disposed opposite to the display cover plate, the display cover plate being fixed on the light emitting surface of the adjacent two sub-display panels, and the at least two prisms being located between the display cover plate and the light emitting surface; wherein
a gap is present between each of the prisms and the display cover plate, and each of the prisms, the display cover plate, and the seam all extend along a first direction; and
the at least two prisms are configured to refract light emitted from the two adjacent sub-display panels to an area of the display cover plate corresponding to the seam; and
wherein the driving method is for driving a target sub-display panel of the display device, the light emitting surface of the target sub-display panel being provided with a target optical compensation strip extending along a first direction;
wherein the method comprises:
determining a first scaling factor of a normal display area of the target sub-display panel, and a second scaling factor of a path-transformation display area of the target sub-display panel respectively, the first scaling factor being positively correlated with a sum of lengths of the normal display area, the path-transformation display area, and the compensation display area of the target optical compensation strip in a second direction, and being negatively correlated with a sum of lengths of the normal display area and the path-transformation display area in the second direction; the second scaling factor being positively correlated with a sum of lengths of the normal display area, the path-transformation display area, and the compensation display area in the second direction, and a length of the path-transformation display area in the second direction respectively; and being negatively correlated with a sum of lengths of the normal display area and the path-transformation display area in the second direction, and a sum of lengths of the path-transformation display area and the compensation display area in the second direction respectively; wherein the second direction is perpendicular to the first direction, and the first direction and the second direction are both parallel to the light emitting surface;
scaling an image in a normal display area of the target sub-display panel along the second direction according to the first scaling factor; and scaling an image in a path-transformation display area of the target sub-display panel along the second direction according to the second scaling factor;

wherein the path-transformation display area is an area of a display area of the target sub-display panel covered by orthographic projections of at least two prisms of the target optical compensation strip, the normal display area is an area of the display area that is not covered by orthographic projections of at least two prisms of the target optical compensation strip, and the compensation display area is an area of the target optical compensation strip covering the seam.

18. The driving method according to claim 17, wherein the first scaling factor $k1$ satisfies: $k1=L1/L0$; and the second scaling factor $k2$ satisfies: $k2=(L1 \times d_2)/(L0 \times d_1)$;

where L1 is a sum of lengths of the normal display area, the path-transformation display area, and the compensation display area in the second direction, L0 is a sum of lengths of the normal display area and the path-transformation display area in the second direction, $d_2$ is a length of the path-transformation display area in the second direction, and $d_1$ is a sum of lengths of the path-transformation display area and the compensation display area in the second direction.

* * * * *